(12) United States Patent
Ishihara et al.

(10) Patent No.: US 7,942,715 B2
(45) Date of Patent: May 17, 2011

(54) ORGANIC LIGHT EMITTING DISPLAY DEVICE AND MANUFACTURING METHOD THEREOF

(75) Inventors: Shingo Ishihara, Mito (JP); Eiji Matsuzaki, Yokohama (JP)

(73) Assignee: Hitachi Displays, Ltd., Chiba (JP)

( * ) Notice: Subject to any disclaimer, the term of this patent is extended or adjusted under 35 U.S.C. 154(b) by 344 days.

(21) Appl. No.: 12/216,555

(22) Filed: Jul. 8, 2008

(65) Prior Publication Data

US 2009/0015151 A1   Jan. 15, 2009

(30) Foreign Application Priority Data

Jul. 9, 2007   (JP) ................................. 2007-179694

(51) Int. Cl.
*H01J 9/24* (2006.01)
(52) U.S. Cl. ........................................................ 445/24
(58) Field of Classification Search .......... 313/500–506; 445/24–26
See application file for complete search history.

(56) References Cited

U.S. PATENT DOCUMENTS

| 2002/0125832 | A1 | 9/2002 | Yokoyama |
| 2006/0060870 | A1* | 3/2006 | Park et al. ........................ 257/88 |
| 2007/0024181 | A1* | 2/2007 | Oh ................................. 313/500 |

FOREIGN PATENT DOCUMENTS

| JP | A-2000-228284 | | 8/2000 |
| JP | 2004-207217 | | 7/2004 |
| JP | 2007-103098 | * | 4/2007 |
| JP | A-2007-103098 | | 4/2007 |

* cited by examiner

*Primary Examiner* — Joseph L Williams
*Assistant Examiner* — Brenitra M Lee
(74) *Attorney, Agent, or Firm* — Antonelli, Terry, Stout & Kraus, LLP.

(57) ABSTRACT

The present invention provides an organic light emitting device in which an upper transparent electrode 10 of an organic light emitting device 2 is connected electrically at a contact hole portion 122 to a current supply line 121 disposed in the same layer as that of and extending in parallel with a gate line 106. That is, a hole transport layer 5 and an electron transport layer 9 of the organic light emitting device 2 are formed over the entire display region, and then a contact hole portion 122 is removed to electrically connect the current supply line 121 and the upper transparent electrode 10, thereby decreasing unevenness of luminance due to wiring resistance of the upper transparent electrode.

7 Claims, 17 Drawing Sheets

ORGANIC LIGHT EMITTING DISPLAY DEVICE AND MANUFACTURING METHOD THEREOF

BACKGROUND OF THE INVENTION

1. Field of the Invention

The present invention relates to decrease in the resistance of an upper transparent electrode of a self-emitting organic electroluminescent device.

2. Description of the Related Art

A self-emitting organic electroluminescent element (hereinafter referred to as an "organic light emitting element") is expected as an illumination device for a thin-screen display device and a liquid crystal display device.

An organic light emitting display device includes a plurality of organic light emitting elements constituting pixels on a substrate and a driving layer for driving the organic light emitting elements. The organic light emitting element has a structure in which a plurality of organic layers are put between a lower electrode and an upper transparent electrode. The plurality of organic layers include at least a transport layer for transporting electron holes, a transport layer for transporting electrons and a light emitting layer for re-combining the electron holes and the electrons. The holes and electrons injected from electrodes are re-combined in the light emitting layer to emit light by application of a voltage between both of the electrodes.

In the general structure, the transport layer is formed over the entire display panel region and used in common as a transport layer for a plurality of organic light emitting elements. With the constitution described above, only the light emitting layer requires patterning comparable with that of a pixel size. For the patterning comparable with that of the pixel size, a precision mask is generally used. Since the precision mask involves a problem of lowering the mass productivity due to mask exchange, etc., it is preferred to decrease the number of its use.

In a usual organic light emitting display device, the upper transparent electrode of the organic light emitting element is used as a common electrode. Accordingly, when a plurality of organic light emitting elements emit light, the entire current for the display panel flows in the upper transparent electrode. In the case of using a highly-resistive transparent conductive film for the upper transparent electrode, unevenness in applied voltages occurs between a pixel comprising an organic light emitting element at the periphery of the display panel near the power source and a pixel comprising an organic light emitting element at the central portion of the display panel due to the wiring resistance caused of the upper transparent electrode, which, as a result, generates unevenness of luminance.

JP-A-2004-207217 discloses the constitution of an organic light emitting display device using an upper transparent electrode. Auxiliary wiring is formed in a layer level with that of a lower electrode of an organic light emitting element. The auxiliary wiring and the upper transparent electrode are connected in a pixel region to decrease unevenness of the wiring resistance in every pixel. For electrically connecting the auxiliary wiring and the upper transparent electrode, it is necessary to remove all the organic layers constituting the organic light emitting element at contact hole portions. Accordingly, for the entire organic layer, a transport layer as well as the light emitting layer has also to be formed by using a precision mask, which results in a problem of lowering the mass productivity.

SUMMARY OF THE INVENTION

The present invention is intended to provide a display device of high image quality in an organic light emitting display device using an organic light emitting element having an upper transparent electrode by decreasing the wiring resistance of the upper transparent electrode and lowering the unevenness of luminance in the display panel.

The present invention provides an organic light emitting display device in which a driving layer containing a driving element for driving an organic light emitting element and the organic light emitting element are sequentially stacked above a substrate, and an upper transparent electrode of out a pair of electrodes putting an organic layer of the organic light emitting element therebetween and a current supply line formed in the driving layer are connected electrically, wherein the organic layer excluding a light emitting layer therefrom is formed over the entire display region, and a portion of the organic layer excluding the light emitting layer therefrom is removed without using a precision mask so that the upper transparent electrode and the current supply line are connected electrically.

Further, the invention provides an organic light emitting display device in which a driving layer containing a driving element for driving an organic light emitting element and the organic light emitting element are sequentially stacked above a substrate, and an upper transparent electrode out of a pair of electrodes putting an organic layer of the organic light emitting element therebetween and a current supply line formed in the layer in which the other lower electrode out of the pair of electrodes is formed are connected electrically, wherein the organic layer excluding the light emitting layer therefrom is formed over the entire display region, and a portion of the organic layer excluding the light emitting layer therefrom is removed without using a precision mask so that the upper transparent electrode and the current supply line are connected electrically.

Further, the invention provides a method of manufacturing an organic light emitting display device in which a driving layer containing a driving element for driving an organic light emitting element and the organic light emitting element are sequentially stacked above a substrate, and an upper transparent electrode out of a pair of electrodes putting an organic layer of the organic light emitting element therebetween and a current supply line formed in a layer different from that of the upper transparent electrode are connected electrically, the method including the steps of forming the organic layer excluding the light emitting layer therefrom is formed over the entire display region and then removing without using a precision mask the electrically connected portion between the upper transparent electrode and the current supply line.

According to the invention, since the current supply line comprising a metal layer level with a driving layer or level with the layer of a lower electrode is connected with the upper transparent electrode to decrease the wiring resistance of the upper transparent electrode, unevenness of luminance in the display panel can be decreased, thus enabling display of high image quality. Further, since the transport layer constituting the organic light emitting element is formed over the entire display region of the display panel, and portions of the transport layer present at the connection portions are then removed, the number of precision masks to be used is decreased.

In the invention, the organic light emitting element includes those having the following structure. That is, it includes sequentially substrate/lower electrode/first injection layer/first transport layer/light emitting layer/second transport layer/second injection layer/upper electrode/protection layer or sealing substrate (opposed substrate).

The lower electrode and the upper electrode include two types of combination. One combination includes the lower electrode as an anode and the upper electrode as a cathode. In this case, the first injection layer and the first transport layer constitute a hole injection layer and a hole transport layer, respectively. Further, the second transport layer and the second injection layer constitute an electron transport layer and an electron injection layer, respectively.

The other combination includes the lower electrode as a cathode and the upper electrode as an anode. In this case, the first injection layer and the first transport layer constitute an electron injection layer and an electron transport layer, respectively. Further, the second transport layer and the second injection layer constitute a hole transport layer and a hole injection layer, respectively.

In the constitution described above, a constitution not having the first injection layer or the second injection layer may is also possible. Further, a structure in which the first transport layer or the second transport layer also serves as a light emitting layer is also possible.

For the upper electrode and the lower electrode, a combination in which one of the electrodes transmits emitted light and the other electrode reflects the emitted light is preferred. In this case, since light is extracted from the light-transmitting electrode, the electrode is referred to as a light extraction electrode. On the other hand, the light-reflecting electrode is referred to as a reflection electrode.

When the upper electrode is the light extraction electrode, it is referred to as a top emission structure. On the other hand, when the lower electrode is the light extraction electrode, it is referred to as a bottom emission structure.

The substrates referred to herein can be selected from a wide range of materials so long as they are dielectric materials. Specifically, inorganic materials such as glass and sintered alumina products and various kinds of insulating plastics such as polyimide film, polyester film, polyethylene film, polyphenylene sulfide film, and polyparaxylene film can be used.

Further, metal materials may also be used with no problem so long as the insulating material described above is formed on the surface. They include specifically stainless steel, aluminum, copper and alloys containing the metals described above, but the substrate materials are not limited to the above materials.

For the anode referred to herein, a conductive film having a large work function for improving the injection efficiency of holes is preferred. They include specifically gold and platinum, but the anode materials are not restricted to the above materials.

Further, the anode may be formed of a binary system such as indium tin oxide (ITO), indium zinc oxide (IZO), and indium germanium oxide, or may be formed of a ternary system such as indium tin zinc oxide. Further, in addition to indium oxide, it may be formed of tin oxide, zinc oxide, etc. as the main ingredient. Further, for ITO, those compositions containing 5 to 10 wt % of tin oxide with respect to indium oxide are used preferably. The method of manufacturing an oxide semiconductor includes, for example, a sputtering method, an EB vapor deposition method, an ion plating method, or the like.

The work functions of the ITO film and the IZO film are 4.6 eV, and 4.6 eV, respectively, which can be increased to about 5.2 eV by UV ozone irradiation, oxygen plasma treatment, etc.

The ITO film is in a polycrystal state when prepared under a condition of elevating the substrate temperature to about 200° C. in a sputtering method. In the polycrystal state, since the surface planarity is poor due to crystal grains, those polished at the surface are preferred. Further, as another method, those formed in an amorphous state and heated into the polycrystal state are preferred.

Further, for the anode, by the provision of the hole injection layer, use of a material of a large work function is no more necessary, and it may be a usual conductive film.

Specifically, in organic materials such as metals, for example, aluminum, indium, molybdenum, and nickel, alloys using such metals, polysilicon, amorphous silicon, tin oxide, indium oxide, indium tin oxide (ITO), etc. are preferred.

Further, in the case of using the anode as the reflection electrode, a multilevel layer in which a transparent conductive film is formed on the reflection electrode of the metal film may also be considered. For each of the layers, the materials described above are preferred. Needless to say, they are not restricted to such materials, and two or more of the materials may be used in combination.

Further, organic materials such as polyaniline or polythiophene or a conductive ink using a convenient coating method for the forming process are preferred. Of course, they are not restricted to such materials, and two or more of the materials may be used in combination.

For the hole injection layer referred to herein, those materials having an appropriate ionization potential are preferred for lowering the injection barrier between the anode and the hole transport layer. Further, it is preferred that the hole injection layer plays a role of burying to smooth surface unevenness of an under layer. Specifically, the materials include, for example, copper phthalocyanine, star burst amine compounds, polyaniline, polythiophene, vanadium oxide, molybdenum oxide, ruthenium oxide, aluminum oxide, but they are not restrictive.

The hole transport layer referred to herein has a role of transporting holes and injecting them into the light emitting layer. Accordingly, the layer preferably comprises a hole transport material of high hole mobility. Further, it is preferably stable chemically. Further, it is preferred that the ionization potential is small. Further, it is preferred that the electron affinity is small. Further, it is preferred that the glass transition temperature is high. Preferred materials for the layer include, specifically, N,N'-bis(3-methylphenyl)-N,N'-diphenyl-{1,1'-biphenyl]-4,4' diamine (TPD), 4,4'-bis[N-(1-naphthyl)-N-phenylamino]biphenyl(α-NPD), 4,4',4"-tri(N-carbazoryl) triphenylamine (TCTA), 1,3,5-tris[N-(4-diphenyl aminophenyl)phenylamino]benzene (p-DPA-TDAB), 4,4', 4"-tris(N-carbazol)triphenylamine (TCTA), 1,3,5-tris[N,N-bis(2-methylphenyl)-amino]-benzene (o-MTDAB), 1,3,5-tris[N,N-bis(3-methylphenyl)-amino]-benzene
(m-MTDAB), 1,3,5-tris[N,N-bis(4-methylphenyl)-amino]-benzene (p-MTDAB), 4,4',4"-tris[1-naphthyl(phenyl)amino] triphenylamine (1-TNATA), 4,4',4"-tris[2-naphthyl(phenyl) amino]triphenylamine (2-TNATA), 4,4',4"-tris[biphenyl-4-yl-(3-methylphenyl)amino]triphenylamine (p-PMTDATA), 4,4',4"-tris[9,9-dimethylfluolene-2-yl(phenyl)amino]triphenylamine (TFATA), 4,4',4"-tris(N-carbazoyl)triphenylamine (TCTA), 1,3,5-tris[N-(4-diphenylaminophenyl)phenylamino]benzene (p-DPA-TDAB), 1,3,5-tris{4-[methylphenyl(phenyl)amino]phenyl}benzene (MTDAPB), N,N'-di(biphenyl-4-yl)-N,N'-diphenyl[1,1'-biphenyl]-4,4'-diamine (p-BPD), N,N'-bis(9,9-dimethylfluolene-2-yl)-N, N'-diphenylfluolene-2,7-diamine (PFFA), N,N,N',N'-tetrakis (9,9-dimethylfluolene-2-yl)-[1,1-biphenyl]4,4'-diamine (FFD), (NDA)PP, 4-4'-bis[N,N'-(3-tollyl)amino]-3-3'-dimethylbiphenyl (HMTPD). The materials are not restrictive, and two or more of the materials may be used in combination.

For the hole transport layer, it is preferred that the hole transporting material contains an oxidant to lower the barrier with respect to the anode, or improve the electroconductivity. Specific examples of the oxidant includes Lewis acid compounds such as ferric chloride, ammonium chloride, gallium chloride, indium chloride, antimony pentachloride, and electron accepting compounds such as trinitrofluolene. They are not restricted to the materials, but two or more of the materials may used in combination.

The light emitting layer referred to herein means a layer in which injected holes and electrons are recombined, and emit light at a wavelength inherent to the material. This includes a case where a host material per se forming the light emission layer emits a light and a case where a dopant material added in a micro amount to the host emits a light. Specific preferred host materials include distyryl arylene derivative (DPVBi), silole derivative having a benzene ring in the skeleton (2PSP), oxodiazole derivative having triphenylamine structure on both ends (EM2), a perynone derivative (P1) having phenanthrene group, oligothiophene derivative having triphenyl amine structure on both ends (BMA-3T), perylene derivative (tBu-PTC), tris(8-quinolinol) aluminum, polyparaphenylene vinylene derivative, polythiophene derivative, polyparaphenylene derivative, polysilane derivative, and polyacetylene derivative. They are not restricted to the materials, but two or more of the materials may be used in combination.

Then, specific preferred dopant materials include quinacrydone, coumarin 6, Nile red, rubrene, 4-(dicyanomethylene)-2-methyl-6-(para-dimethylaminostyryl)-4H-pyrane (DCM), dicarbazole derivative, porphyrin platinum complex (PtOEP), iridium complex (Ir(ppy)3). They are not restricted to the materials, but two or more of the materials may be used in combination.

The electron transport layer referred to herein has a role of transporting electrons and injecting them into the light emitting layer. Accordingly, it preferably comprises an electron transporting material of high electron mobility. Specifically, tris(8-quinolinol) aluminum, oxadiazole diazole derivative, silole derivative, zinc benzothiazole complex, and basocuproin (BCP) are preferred. Further, they are not restricted to the materials, but two or more of the materials may be used in combination.

Further, for the electron transport layer, it is preferred that the electron transporting material contains a reducing agent to lower the barrier with respect to a cathode, or improve the electroconductivity. Specific example of the reducing agent includes alkali metals, alkaline earth metals, alkali metal oxides, alkaline earth oxides, rare earth oxides, alkali metal halides, alkaline earth halides, rare earth halides, and complexes formed with an alkali metal and an aromatic compound. Particularly preferred alkali metals are Cs, Li, Na, and K. They are not restricted to the materials, but two or more of the materials may be used in combination.

The electron injection layer referred to herein is used for improving the electron injection efficiency from the cathode to the electron transport layer. Specifically, lithium fluoride, magnesium fluoride, calcium fluoride, strontium fluoride, barium fluoride, magnesium oxide, and aluminum oxide are preferred. They are not restricted to the materials, but two or more of the materials may be used in combination.

For the cathode referred to herein, a conductive film of a small work function for improving the electron injection efficiency is preferred. The material includes specifically magnesium silver alloy, aluminum lithium alloy, aluminum calcium alloy, aluminum magnesium alloy, and metal calcium, but they are not restricted to the materials.

Further, when the electron injection layer described above is disposed, use of the material of low work function is no more necessary as the condition for the cathode, and general metal materials can be used. Specifically, metals such as aluminum, indium, molybdenum or nickel, alloys using the metals, or polysilicon or amorphous silicon is preferred.

The protective layer referred to herein is formed on the upper electrode and is intended for preventing atmospheric $H_2O$, $O_2$ from intruding into the upper electrode or the organic layer below.

Specifically, inorganic materials such as $SiO_2$, $SiNx$, $Al_2O_3$ and organic materials such as polychloropyrene, polyethylene terephthalate, polyoxymethylene, polyvinyl chloride, polyvinylidene fluoride, cyanoethyl pullulan, polymethyl methacrylate, polysulfone, polycarbonate, and polyimide can be enumerated, but they are not restricted to the materials.

In the organic light emitting display device according to the invention, the organic light emitting element is preferably used for a pixel. Further, for the organic light emitting display device according to the invention, a color conversion layer is used preferably.

The organic light emitting display device referred to herein means a display device using an organic light emitting element for a pixel. The organic light emitting display device includes a simple matrix organic light emitting display device and an active matrix organic light emitting display device.

In the simple matrix organic light emitting display device, organic layers such as a hole transport layer, a light emitting layer, and an electron transport layer are formed at positions where a plurality of anode lines and cathodes line intersect, and each of the pixels is lit up only for a selected time during 1 frame period. The selection time is a time interval obtained by dividing the 1 frame period by the number of anode lines.

In the active matrix organic light emitting display device, a driving element constituted with 2 to 4 switching elements of thin film transistors and capacitors is connected to the organic EL (light emitting) element constituting each of the pixels, and lighting up during a full period of one frame is possible. Accordingly, it is not necessary to increase the luminance and the life of the organic light emitting element can be made longer.

The pixel referred to herein means minimum units arranged in plurality in the longitudinal and lateral directions on the screen of a display device for displaying characters or graphics in a display region. Further, a sub-pixel means a minimum unit for further dividing the pixel in a display device conducting color display. For color images, a structure constituted with green, red, and blue tricolor sub pixels is general. Further, the display region means a region where images are displayed in a display device.

The current supply source line referred to herein is an interconnection connecting an organic EL device and a power source. In the active matrix organic light emitting display device, the first current supply line is an interconnection for connecting a power source and the lower electrodes of the organic EL device via a source drain electrode of a switching element. A second current supply line is an interconnection for connecting a power source and an upper electrode as an electrode in common with each of pixels.

The color conversion layer referred to herein means a layer for converting light emitted in an organic light emitting element as a pixel or a sub-pixel into light of other color. The constitution of the color conversion layer is divided into a structure of layering above an organic light emitting element and a structure of layering above a opposed substrate.

In the structure of layering above the organic light emitting element, the color conversion layer is formed directly or via a protection layer above the organic light emitting element as a pixel or a sub-pixel portion. A black matrix is formed between pixels or sub-pixels in order to prevent the light emission of the color conversion layer due to the light emission from adjacent pixels or sub-pixels. The order of forming the black matrix and the color conversion layer is not particularly specified. A protective layer is formed optionally thereon.

In the structure of forming the color conversion layer on the opposed substrate, a black matrix, a color conversion layer, and a protection layer are formed above the opposed substrate described above, and they are bonded with the organic EL substrate. In this case, they are adjusted and attached such that a predetermined color conversion layer is located above the pixel or the sub-pixel.

The color conversion layer generally includes a color filter layer and a color conversion layer. The color filter layer means those emitting a portion of spectra of incident light. The material for the color filter contains a pigment and a binder resin. The pigment includes a red pigment, a blue pigment, a green pigment, etc.

Specific examples of the red pigment includes preferably perylene pigments, lake pigments, azo pigments, quinacrydone pigments, anthracene pigments, isoindoline pigments, isoindolinone pigments, etc. Further, they are not restricted to the above materials, but two or more of the materials may be used in combination.

Specific examples of the blue pigment includes preferably copper phthalocyanine pigment, indanthrone pigment, indophenol pigment, cyanine pigment, dioxadine pigment, etc. Further, they are not restricted to the above materials, but two or more of the materials may be used in combination.

As specific examples of the green pigment, coumarine type pigment, etc. are preferred.

As the binder resin, transparent materials having a transmittance of a more than 50% in a visible light region are preferred. They include specifically polymethyl methacrylate, polyacrylate, polycarbonate, polyvinyl alcohol, polyvinyl pyrrolidine, hydroxyethyl cellulose, carboxyethyl cellulose, etc. They are not restricted to the above materials, but two or more of the materials may be used in combination.

The method of forming the color filter includes, for example, a dyeing method, a pigment dispersion method, a printing method, or an electrodeposition method, but it is not limited to the above.

The color conversion layer referred to herein includes a color conversion fluorescent layer that is excited by incident light to emit fluorescence and a correction color filter layer for correcting exit spectra.

The color conversion fluorescent layer contains a fluorescence pigment and a binder resin. The fluorescence pigment includes a red fluorescence pigment, green fluorescence pigment, etc.

Specific examples of the red fluorescent dye include cyanine dyes such as 4-dicyanomethylene-2-methyl-6-(p-dimethylaminostyryl)-4H-pyran, pyridine pigments such as 1-ethyl-2-[4-(p-dimethyl aminophenyl)-1,3 butadienyl]-pyridium-perchlorate, rhodamine pigments such as rhodamine B, rhodamine 6 G, or oxadine type pigment. They are not restricted to the above materials, but two or more of the materials may also be used in combination.

Specific examples of the green fluorescent pigment include coumarin pigments such as 2,3,5,6-1H, 4H-tetrahydro-8-trifluoromethyl quinolidino (9, 9a, 1-gh) coumarin, 3-(2'-benzothiazoryl)-7-diethylamino coumarin, and 3-(2'-benzimidazoryl)-7-N,N-diethylamino coumarin, coumarin pigment type dyes such as basic yellow and solvent yellow. They are not restricted to the above materials, but two or more of the materials may be used in combination.

BRIEF DESCRIPTION OF THE DRAWINGS

Other objects and advantages of the invention will become apparent from the following description of embodiments with reference to the accompanying drawings in which.

DESCRIPTION OF THE PREFERRED EMBODIMENTS

First Embodiment

Figure 1:
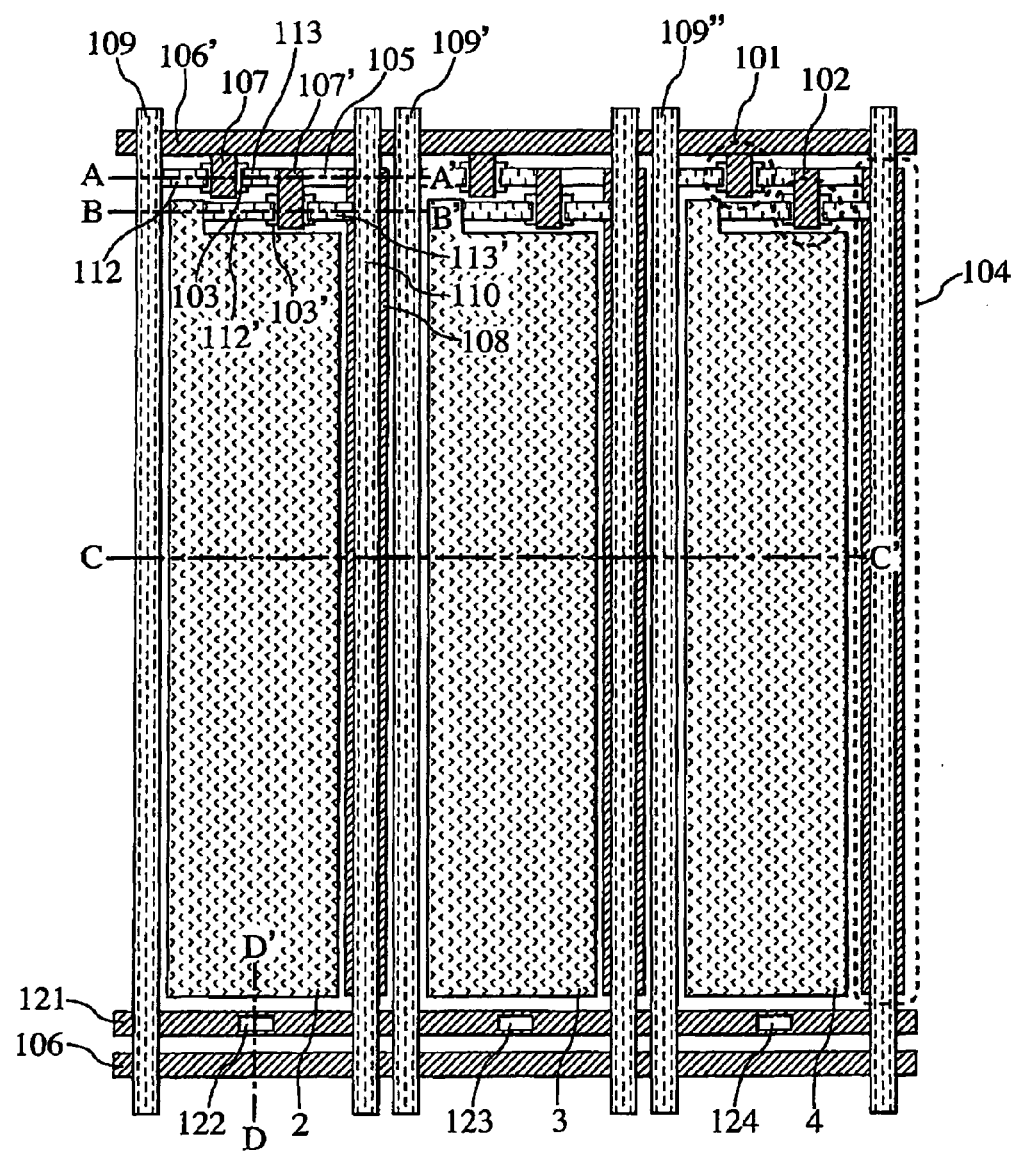
FIG. 1 is a plan view of a pixel of an organic light emitting display device.
Figure 2A:
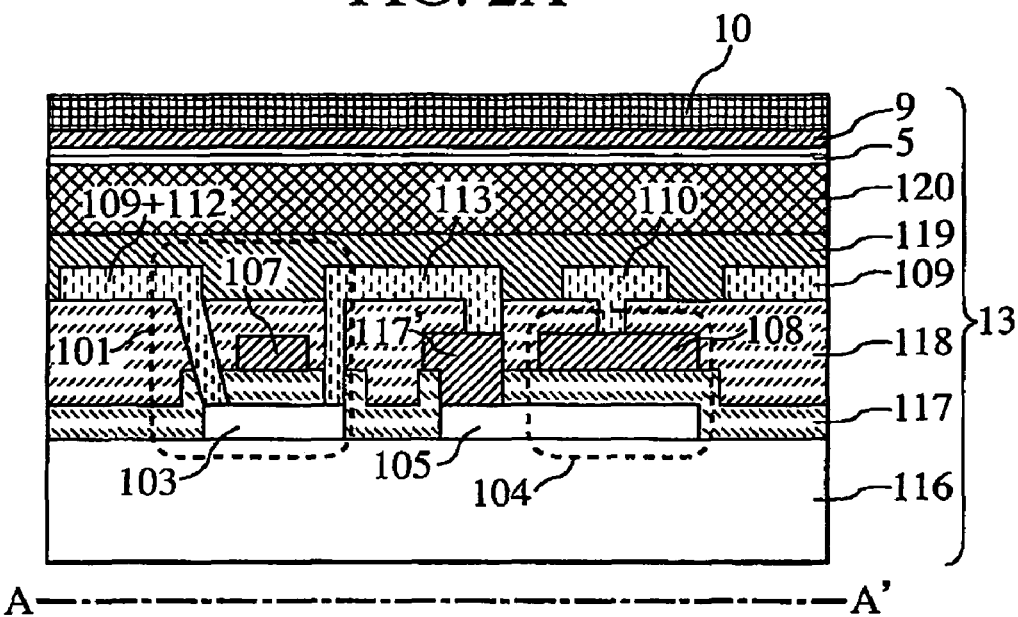
FIG. 2A is a cross sectional view taken along the line A-A' shown in FIG. 1.
Figure 2B:
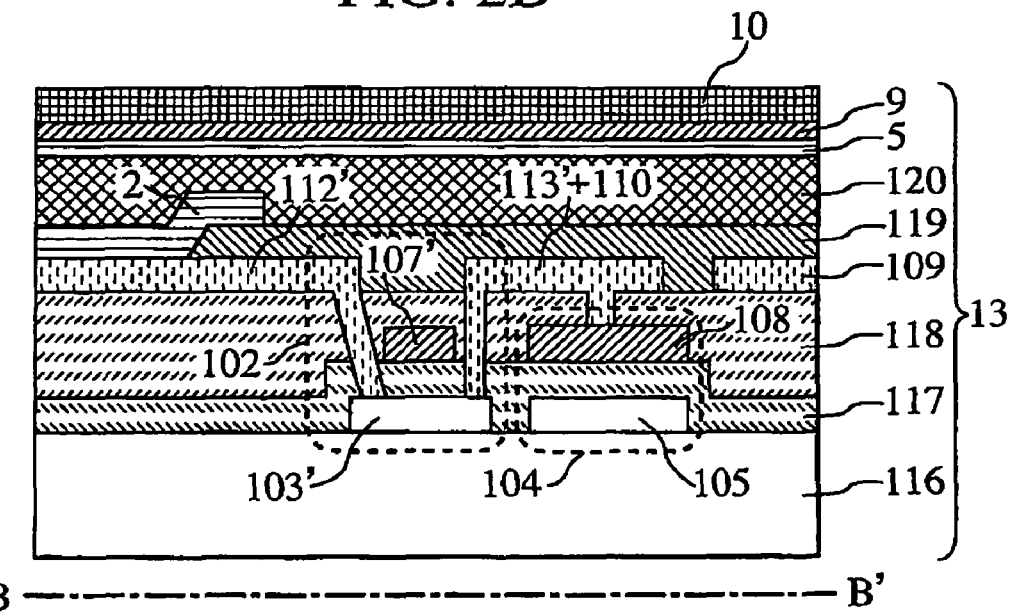
FIG. 2B is a cross sectional view taken along the line B-B' shown in FIG. 1.
Figure 3:
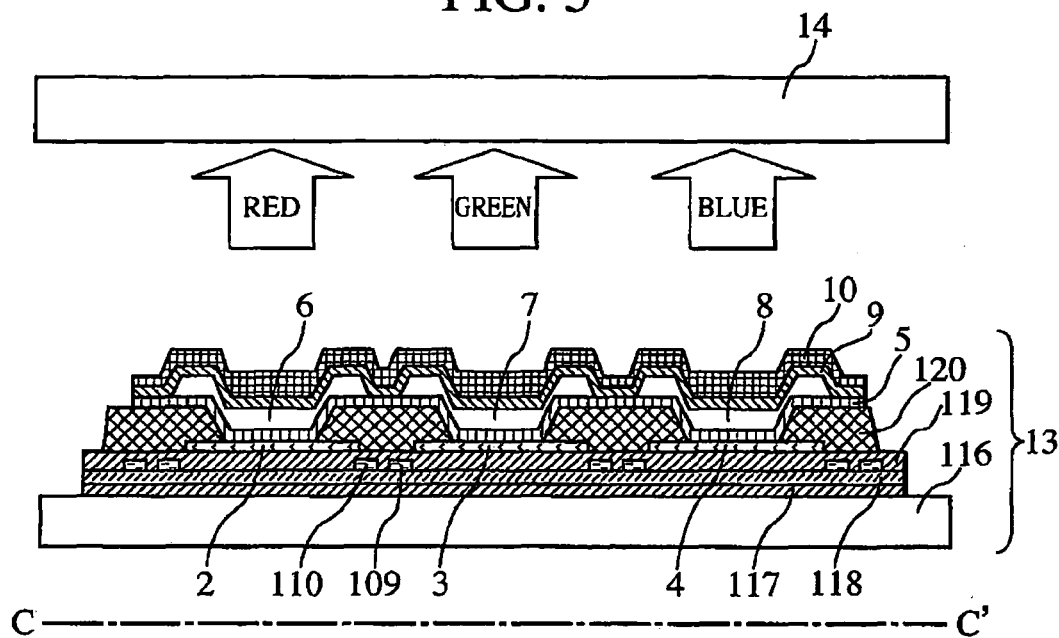
FIG. 3 is a cross sectional view taken along the line C-C' shown in FIG. 1.
Figure 4:
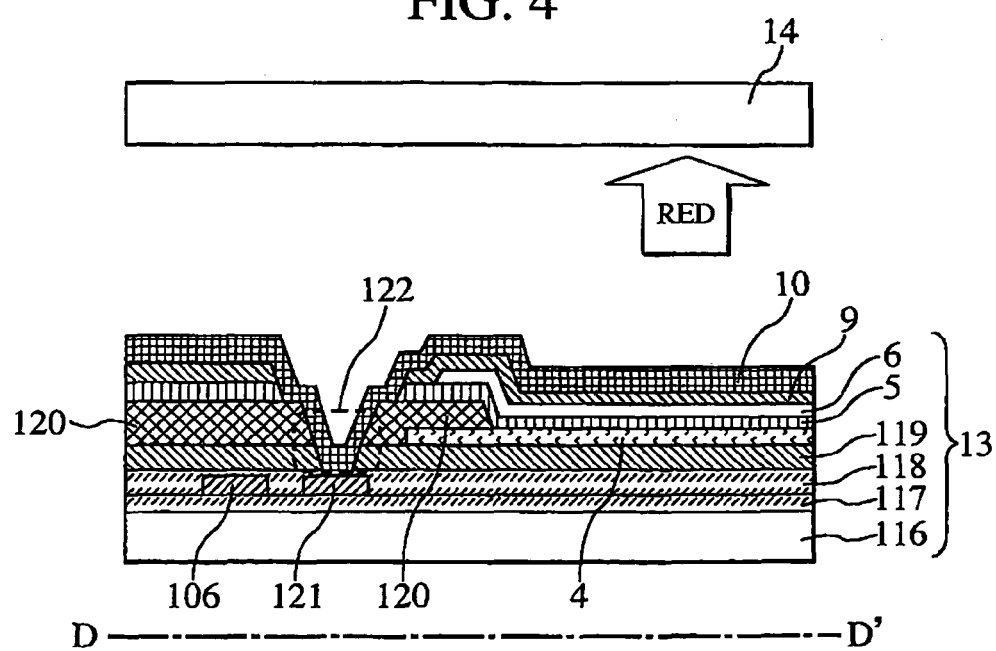
FIG. 4 is a cross sectional view taken along the line D-D' shown in FIG. 1.

A preferred embodiment of an organic light emitting display device according to the invention is to be described with reference to the drawings. FIG. 1 is a plan view of a pixel of the organic light emitting display device. FIG. 2A is a cross sectional view taken along the line A-A' shown in FIG. 1, and FIG. 2B is a cross sectional view taken along the line B-B' shown in FIG. 1. FIG. 3 is a cross sectional view taken along the line C-C' shown in FIG. 1. FIG. 4 is a cross sectional view taken along the line D-D' shown in FIG. 1.

In FIG. 1 to FIG. 4, above a glass substrate 116, a plurality of gate lines 106 are disposed at predetermined intervals, and data lines 109 for transmitting image information are also disposed at predetermined intervals in the direction intersecting each of the gate lines. That is, the gate lines 106 and the data lines 109 are arranged in matrix, and regions surrounded by gate lines 106 and the data lines 109 each constitute a display region for one pixel or one sub-pixel. Further, a plurality of first current supply lines 110 connected with a power source are arranged in parallel with the data lines 109 above the glass substrate 116. Further, a plurality of second current supply lines 121 connected with the power source are situated in parallel with the gate lines 106. The gate lines 106, the data lines 109, the first current supply lines 110, and the second current supply lines 121 are formed as interconnections belonging to an interconnection layer via an interlayer insulating film above the glass substrate 116.

A plurality of organic light emitting elements constituting a pixel as a minimum unit of color images are arranged on the upper side of the interconnection layer. As shown in FIG. 3, the organic light emitting elements have as sub-pixels (sub-picture elements) an organic layer containing a hole transport layer 5, light emitting layers 6, 7, 8, and an electron transport layer 9 and lower electrodes 2, 3, 4 and upper transparent electrode 10 for sandwiching the organic layer. The lower electrodes 2 to 4 of the organic light emitting elements belonging to a pixel are connected via transistors as driving elements to the first current supply lines 110, and the upper transparent electrode 10 of the organic light emitting elements belonging to a pixel is connected to the second current supply line 121 connected to the power source.

Further, a driving layer for driving the organic layer of each pixel is formed above the glass substrate 116. The driving layer includes a first transistor 101, a second transistor 102, and a capacitor 104 as driving elements. In the first transistor 101, a gate electrode 107 is connected to the gate line 106', a source electrode 112 is connected to the data line 109, and a drain electrode 113 is connected to the gate electrode 107' of the second transistor and the lower electrode 105 of the capacitor 104. In the second transistor 102, a drain electrode 113' is connected to the upper electrode 108 of the capacitance 104 and the first current supply line 110, and a source electrode 112' is connected to the lower electrodes 2 to 4.

Next, a method of manufacturing the organic light emitting display device having the above constitution is to be described. First, an amorphous silicon (a-Si) film of a 50 nm thickness is formed above the glass substrate 116 by using a low pressure chemical vapor deposition method (LPCVD method). The starting material is $Si_2H_6$, and the substrate temperature is set to 450° C. Then, the entire film surface is subjected to laser annealing by using an XeCl excimer laser. The laser annealing is conducted in two steps, and the irradiation energy in the first step and that in the second step are 188 mJ/cm$^2$ and 290 mJ/cm$^2{}_1$ respectively. Thus, the amorphous silicon is crystallized into polysilicon (p-Si). Then, the polysilicon is patterned by dry etching using $CF_4$, and as shown in FIG. 2, an active layer 103 of the first transistor 101, an active layer 103' of the second transistor 102, and the lower electrode 105 of the capacitor 104 are formed.

Then, an $SiO_2$ film of a 100 nm thickness is formed as a gate insulating film 117. The $SiO_2$ film is formed from tetraethoxysilane (TEOS) by a plasma enhanced chemical vapor deposition method (PECVD method).

Then, a TiW film of a 50 nm thickness is formed by a sputtering method and patterned as the gate electrodes 107 and 107'. The gate line 106, the second current supply line 121, and the upper transparent electrode 108 of the capacitor 104 are also patterned at the same time.

Then, by an ion implantation method, P ions at $4 \times 10^{15}$ ions/cm$^2$ and at an energy of 80 kev are implanted into the patterned polysilicon layer from a portion above the gate insulating film 117. In this case, P ions are not implanted to the region where the gate electrodes 107 and 107' are present above, which regions are to become the active regions 103 and 103'.

Then, the glass substrate 116 is heated in an inert $N_2$ atmosphere at 300° C. for 3 hours to activate P ions so that doping is conducted effectively. The ion implanted region of the polysilicon (P—Si) has a surface resistance value of 2 k$\Omega$/□. A silicon nitride (SiNx) film is formed thereon as a first interlayer insulating film 118. The thickness of the film is 200 nm.

Then, as shown in FIG. 2, a contact hole (not illustrated) is formed in the gate insulating film 117 and the first interlayer insulating film 118 located above both ends of the active layers 103 and 103'. Further, a contact hole (not illustrated) is formed in the first interlayer insulating film 118 located above the gate electrode 107' of the second transistor 102. Further, a contact hole (not illustrate) is formed in the first interlayer insulating film 118 located above the upper electrode 108 of the capacitor 104.

An Al film of a 500 nm thickness is formed on them by a sputtering method. The data line 109 and the first current supply line 110 are formed by a photolithographic process. Further, the source electrode 112 and the drain electrode 113 of the first transistor 101 and the source electrode 112' and the drain electrode 113' of the second transistor 102 are formed.

As described above, the lower electrode 105 of the capacitor 104 and the drain electrode 113 of the first transistor 101 are connected, and the source electrode 112 of the first transistor 101 and the data line 109 are connected. Further, the drain electrode 113 of the first transistor 101 is connected to the gate electrode 107' of the second transistor 102, and the drain electrode 113' of the second transistor 102 is connected to the first current supply line 110. Further, the upper electrode 108 of the capacitor 104 is connected to the first current supply line 110.

Then, an SiNx film is formed as the second interlayer insulating film 119. The film thickness is 500 nm. In some cases, an organic insulating film is formed as a planarization film on the SiNx film. Further, as shown in FIG. 2B, a contact hole (not illustrated) is formed in the upper portion of the drain electrode 112' of the second transistor 102, and a Cr film of a 150 nm thickness is formed thereon by using a sputtering method. The lower electrodes 2 to 4 are then formed by using a photolithographic method.

Then, an acrylic insulating film of a 2 μm thickness is formed as a third interlayer insulating film 120. Further, as shown in FIG. 4, contact holes 122, 123, and 124 are formed as the portions for connecting the second current supply line 121 and the later-described upper transparent electrode 10 by using a photolithographic method. The third interlayer insulating film 120 covers the lower electrodes 2 to 4 from the end to the portion 3 μm inside. This is to prevent short-circuits between the lower electrodes 2 to 4 and the upper transparent electrode 10 to be described later.

While the acrylic insulating film is used for the third interlayer insulating film, this is not restrictive. The third insulating film may be formed from the organic dielectric materials such as, for example, polychloropyrene, polyethylene terephthalate, polyoxymethylene, polyvinyl chloride, polyfluorovinylidene, cyanoethyl pullulan, polymethyl methacrylate, polysulfone, polycarbonate, and polyimide. Further, inorganic materials such as $SiO_2$, $SiNx$, $Al_2O_3$, etc. can also be used. Further, the structure in which an inorganic insulating film is stacked on an organic insulating film can also be used.

Next, the structure of an organic light emitting device as a pixel is to be described with reference to FIG. 3. The glass substrate 116 fabricated as far as the lower electrodes 2 to 4 is ultrasonically cleaned with pure water, dried by spinning, and then dried in an oven at 120° C. for 30 minutes.

Then, a film of 4,4-bis[N-(1-naphthyl)-N-phenylamino] biphenyl (hereinafter referred to as α-NPD) is formed to a 50 nm thickness above the lower electrode 2 by a vacuum vapor deposition method. The vapor deposition speed of α-NPD is set to 0.15±0.01 nm/sec. The α-NPD film is formed over the entire light emitting display area to function as the hole transport layer 5.

Next, description is to be made for the formation of the light emitting layer in each of sub-pixels. The lower electrode 2 functions as a sub-pixel of red emission color (hereinafter referred to as "R sub-pixel"). A 30-nm thick film of tris(8-quinolinol) aluminum (hereinafter referred to as "Alq3") and coumarin is formed on the hole transport layer 5 by a co-vapor deposition method. The vapor deposition rates of Alq3 and coumarin are 0.20±0.01 nm/sec and 0.01±0.005 nm/sec, respectively. The co-vapor-deposited film functions as the R light emitting layer 6. In the R light emitting layer 6, coumarin functions as a dopant that determines the light emission color. The co-vapor-deposited film of Alq3 and coumarin is patterned by using a precision mask having an aperture pattern of a size equivalent to that of the sub-pixel.

Next, the sub-pixel of green light emission color (hereinafter referred to as "G sub-pixel") formed above the lower electrode 3 is to be described. A 30-nm thick film of Alq3 and quinacridone is formed on the hole transport layer 5 by a co-vapor deposition method. The vapor deposition rates of the Alq3 and quinacridone are set to 0.20±0.01 nm/sec and 0.01±0.005 nm/sec, respectively. The co-vapor deposited film functions as a G light emission layer 7. In the G light emission layer, quinacridone functions as a dopant that determines the light emission color. The co-vapor deposited film of Alq3 and quinacridone is patterned by using a precision mask having an aperture pattern of a size equivalent to that of the sub-pixel.

Next, the sub-pixel of blue light emission color (hereinafter referred to as "B sub-pixel") formed above the lower electrode 4 is to be described. A 30-nm thick film of Alq3 and a styryl amine compound: 1,4'-bis[N-(3-methylphenyl)-N'-phenyl-4-aminophenyl vinylene]-2,5-dimethoxybenzene (hereinafter referred to as "DSA"), is formed on the hole transport layer 5 by a co-vapor deposition method. The vapor deposition rates of the Alq3 and DSA are set to 0.20±0.01 nm/sec and 0.01±0.005 nm/sec, respectively. The co-vapor deposited film functions as a B light emission layer 8. In the B light-emission layer, DSA functions as a dopant that determines the light emission color. The co-vapor deposited film of Alq3 and DSA is patterned by using a precision mask having an aperture pattern of a size equivalent to that of the sub-pixel.

Then, on the light emitting layers 6 to 8 of each color, a 30-nm thick film of Alq3 is formed by a vacuum vapor deposition method. The vapor deposition rate of Alq3 is 0.15±0.01 nm/sec. The Alq3 film is formed over the entire surface of the light emitting display area and functions as the electron transport layer 9.

Then, as shown in FIG. 4, organic films in the contact hole portions 122, 123, and 124 for connecting the second current supply line 121 and the upper transparent electrode 10 are removed. In this embodiment, the α-NPD film of the hole transport layer 5 and the Alq3 film of the electron transport layer 9 are vapor deposited over the entire surface of the light emission display area. Methods of removing the vapor-deposited film include laser abrasion. In the case of using a laser with a wavelength that is absorbed by the organic material, the organic material is removed by sublimation or the like due to temperature elevation of the organic material that absorbs the laser light. In the case of an organic material in direct connection with the metal interconnection layer, the organic material can be removed by the heat generated by the metal interconnection layer irradiated with the laser. Locations for conducting laser abrasion include, for example, a vacuum tank, a glove box of a dry $N_2$ atmosphere, etc.

Then, a mixed film of Mg and Ag is formed as an electron injection layer over the electron transport layer 9. In this case, the film is vapor-deposited to a thickness of 10 nm by setting the vapor deposition rates to 0.14±0.05 nm/s and 0.01±0.005 nm/s, respectively, by using a simultaneous vacuum deposition method.

Then, an In—Zn—O film (hereinafter referred to as "IZO film") of a 50 nm thickness is formed by a sputtering method. The film functions as the upper transparent electrode 10, which is an amorphous oxide film. As the target in this case, a target having a ratio of In/(In+Zn)=0.83 is used. The film is formed in a vacuum of 0.2 Pa and at a sputtering output of 2 $W/cm^2$, with a mixed gas containing Ar and $O_2$ used as an atmosphere. The layered film of the Mg:Ag film and the In—Zn—O film has a transmittance of 65%.

The upper transparent electrode 10 is connected electrically to the second current supply lines 121 in the contact hole portions 122, 123, and 124 disposed in each of the pixel region.

With the above method, a TFT substrate 13 in which the driving layer and the plural organic light emitting elements are formed above the glass substrate 116 can be formed.

Then, the TFT substrate 13 is transferred without exposing it to an atmospheric air to a sealed chamber maintaining a high-dew-point temperature by circulating a dry nitrogen gas.

Then, a glass substrate is introduced to the sealed chamber. The glass substrate serves as an opposed substrate 14. A photocurable resin is applied (not illustrated) by using a seal dispenser to an edge portion of the glass sealing substrate.

The sealing substrate 14 and the TFT substrate 13 are pressure-bonded in the sealed chamber. A light shielding plate is placed onto the outer side of the sealing substrate 14 such that UV light does not hit the entire light emitting elements, and the UV light is irradiated from the sealing-substrate-14 side to cure the photocurable resin.

The method of constituting and the method of manufacturing the top-emission-type organic light emitting display device have been described as above. As the feature of the organic light emitting display device, the second current supply line and the gate line constituting the driving layer are provided in the same layer, and the second current supply line is connected electrically with the upper transparent electrode. With the above structure, the difference of voltage drops between the periphery and the central portion of the display panel due to the resistance of the upper electrode can be reduced; the difference of current values is as small as 3%, and unevenness of luminance in the display panel is suppressed.

Second Embodiment

Next, a second embodiment of the organic light emitting display device according to the invention is to be described.

Figure 5:
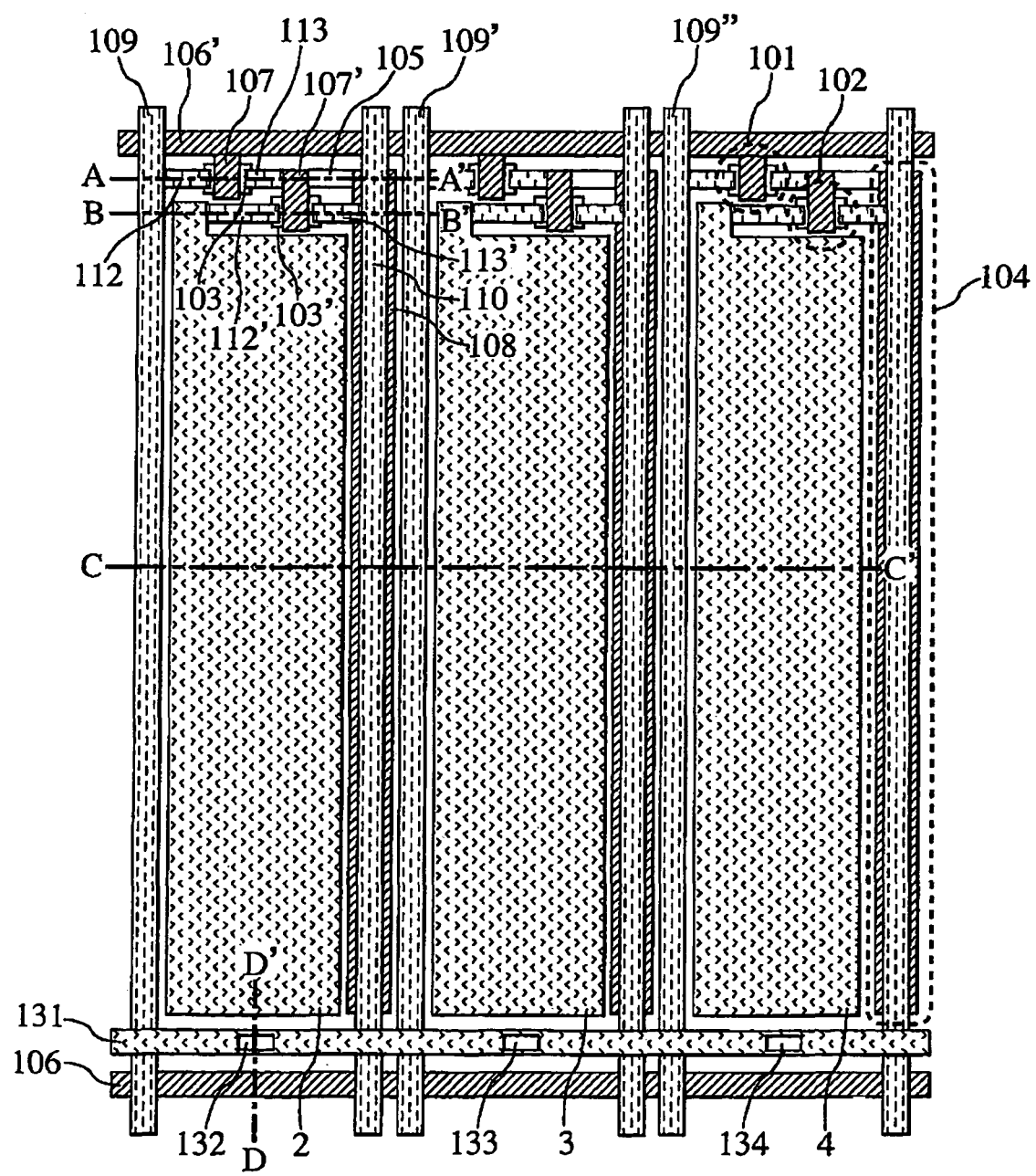
FIG. 5 is a plan view of a pixel of another organic light emitting display device.
Figure 6:
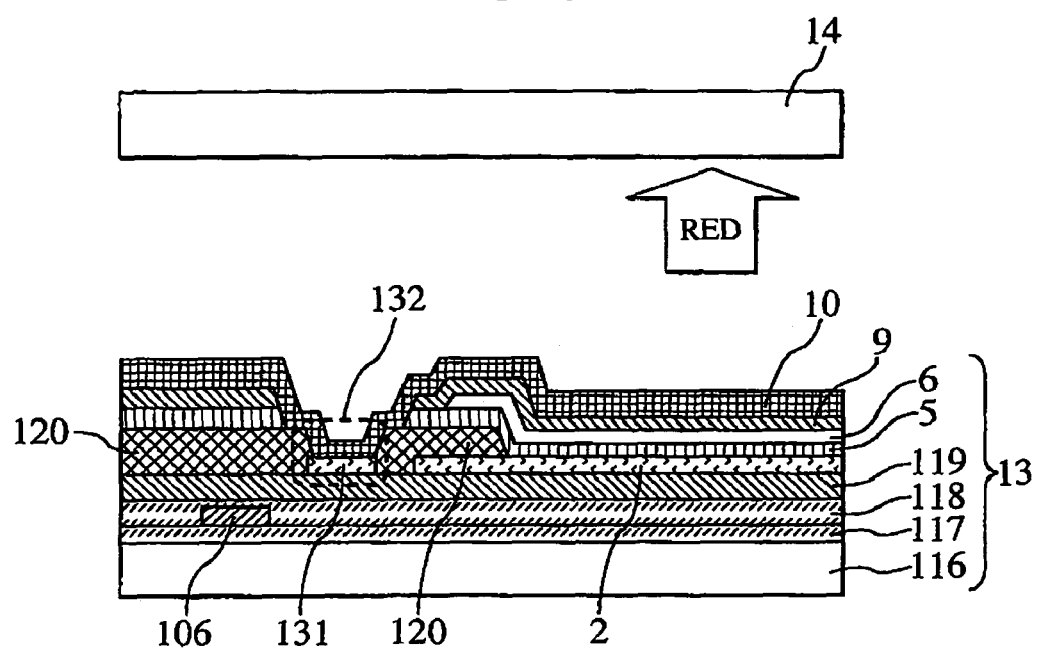
FIG. 6 is a cross sectional view taken along the line D-D' shown in FIG. 5.

FIG. 5 is a plan view of a pixel of the organic light emitting display device, and FIG. 6 is a cross sectional view taken along the line D-D' shown in FIG. 5. This embodiment is characterized in that a second current supply line 131 and the lower electrodes 2 to 4 are formed in the same layer. With this configuration, step disconnection of the upper transparent electrode 10 at the periphery of the contact holes can be suppressed.

Specifically, the method of forming the first transistor 101, the second transistor 102, the capacitor 104, the data line 109, the gate line 106, the first current supply line 110, the gate insulating film 117, the first interlayer insulating film 118, the second interlayer insulating film 119 and the lower-electrodes 2 to 4 above the glass substrate 116 is identical with that of the first embodiment.

As shown in FIG. 6, the second current supply line 131 and the lower electrode 2 are formed in the same layer. The third interlayer insulating film 120 is formed thereon, and portions of the film present at the sub-pixel portion and the contact hole portion are removed. Manufacturing conditions for them are identical with those in the first embodiment.

Then, the hole transport layer 5, the R light emitting layer 6, the G light emitting layer 7, the B light emitting layer 8, and the electron transport layer 9 are formed. The conditions for manufacturing them are identical with those in the first embodiment. Then, portions of the hole transport layer 5, of the electron transport layer 9, and of the third interlayer insulating film 120 present at the contact holes 132, 133, and 134 are removed. The removing method is identical with that in the first embodiment.

Then, the upper transparent electrode 10 is formed thereover. The manufacturing conditions are identical with those in the first embodiment.

With the procedures described above, the upper transparent electrode 10 is connected electrically to the second current supply line 131. In this embodiment, since the upper transparent electrode 10 overrides only the third interlayer insulating film 120, step disconnection at the contact hole portion is suppressed.

The manufacturing method and the manufacturing conditions for superimposing the opposed electrode 14 on the TFT substrate 13 are identical with those in the first embodiment.

In this embodiment, since the second current supply line 131 disposed in the same layer as those of the lower electrodes 2 to 4 and the upper transparent electrode 10 are connected inside the pixel region in the same manner as in the first embodiment, unevenness of luminance in the display panel is suppressed. Further, since the upper transparent electrode 10 overrides only the third interlayer insulating film 120, the step disconnection of the upper transparent electrode 10 is suppressed.

Third Embodiment

Figure 7:
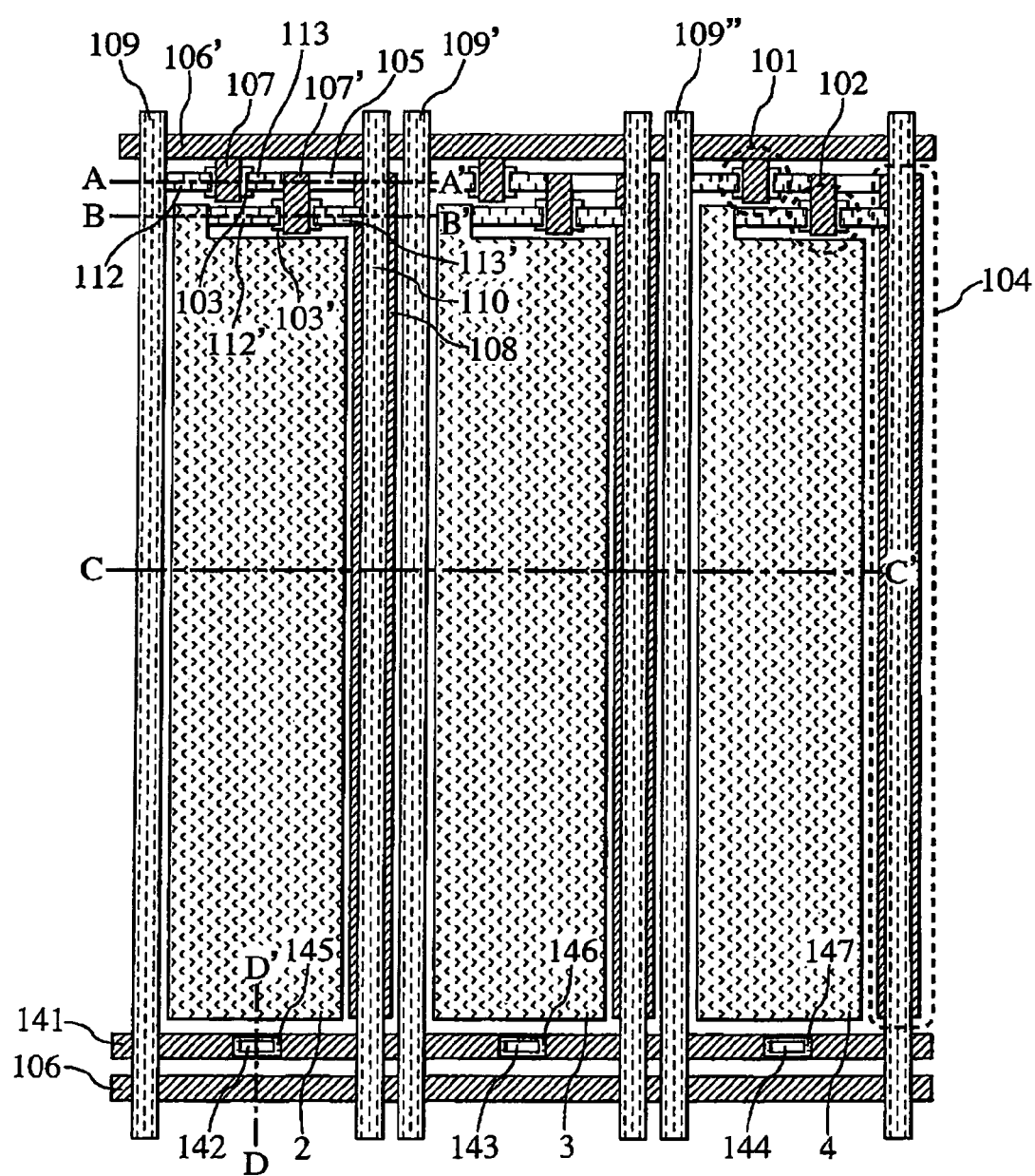
FIG. 7 is a plan view of a pixel of another organic light emitting display device.
Figure 8:
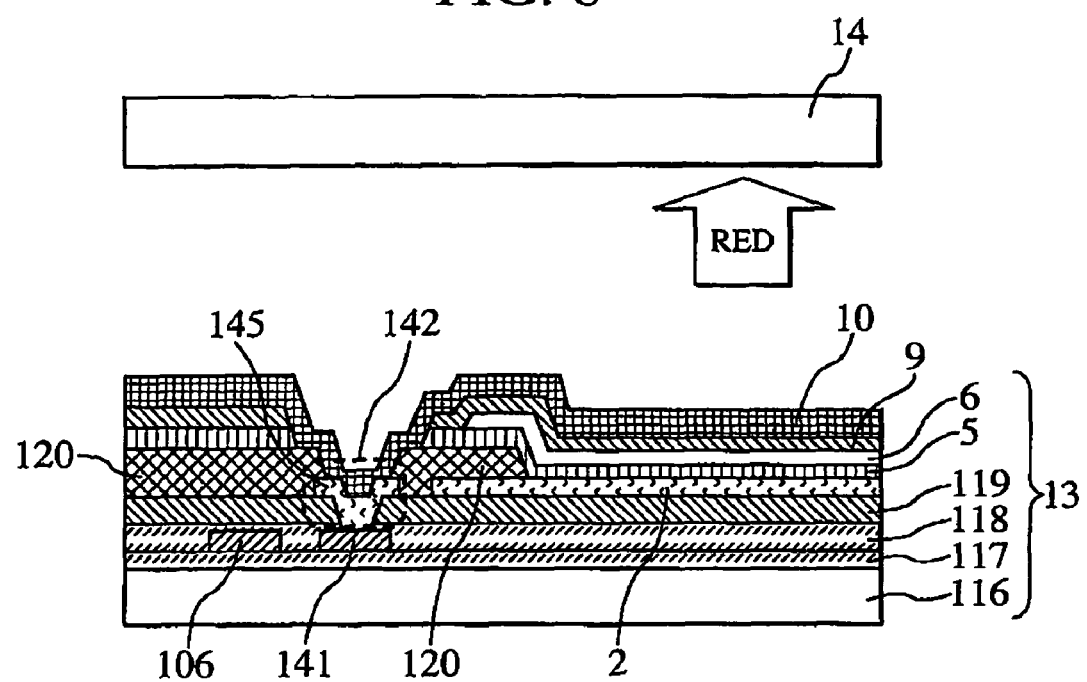
FIG. 8 is a cross sectional view taken along the line D-D' shown in FIG. 7.

Next, a third embodiment of the organic light emitting display device according to the invention is to be described. FIG. 7 is a plan view of a pixel of the organic light emitting display device, and FIG. 8 is a cross sectional view taken along the line D-D' shown in FIG. 7. In this embodiment, a second current supply line 141 formed in the same layer as those of the gate line 106 and the upper transparent electrode 10 are connected electrically via a metal layer level with the lower-electrodes 2 to 4. Therefore, step disconnection of the upper transparent electrode 10 near the contact hole is suppressed.

Specifically, the first transistor 101, the second transistor 102, the capacitor 104, the data line 109, the gate line 106, the second current supply line 141, the first current supply line 110, the gate insulating film 117, the first interlayer insulating film 118, and the second interlayer insulating film 119 are formed above the glass substrate 116. Manufacturing conditions are identical with those in the first embodiment.

Then, portions of the first interlayer insulating film 118 and of the second interlayer insulating film 119 present at the contact hole portions 142, 143, and 144 are removed. Then, the lower electrodes 2 to 4 and metal layers 145, 146, and 147 are formed. Manufacturing conditions for the lower electrodes 2 to 4 are identical with those in the first embodiment.

Then, the third interlayer insulating film 120 is formed, and its portions present at the lower electrode portions 2 to 4 and the contact hole portions 142, 143, and 144 are removed. Manufacturing conditions are identical with those in the first embodiment.

The hole transport layer 5, the R light emitting layer 6, the G light emitting layer 7, the B light emitting layer 8, and the electron transport layer 9 are formed thereabove, and a portion of the hole transport layer 5 and a portion of the electron transport layer 9 are removed to form the upper electrode 10. Manufacturing conditions for them are identical with those in the first embodiment.

Manufacturing method and manufacturing conditions for superimposing the opposed substrate 14 on the TFT substrate 13 are identical with those in the first embodiment.

With the procedures described above, the upper transparent electrode 10 is connected electrically with the second current supply line 141 via the metal layers 145, 146, and 147. In this embodiment, since the upper transparent electrode 10 overrides only the third interlayer insulating film 120, step disconnection at the contact hole portion is suppressed.

In this embodiment, in the same manner as in the first embodiment, since the second current supply line 141 disposed in the same layer as those of the gate line 106 and the upper electrode 10 are connected inside the pixel region, unevenness of luminance in the display panel is suppressed. Further, the upper transparent electrode 10 overrides only the third interlayer insulating film 120, step disconnection of the upper transparent electrode 10 is suppressed. Further, since the second current supply line 141 and the lower electrodes 2 to 4 are present in separate layers, the aperture ratio of the pixel can be increased.

Fourth Embodiment

Figure 9:
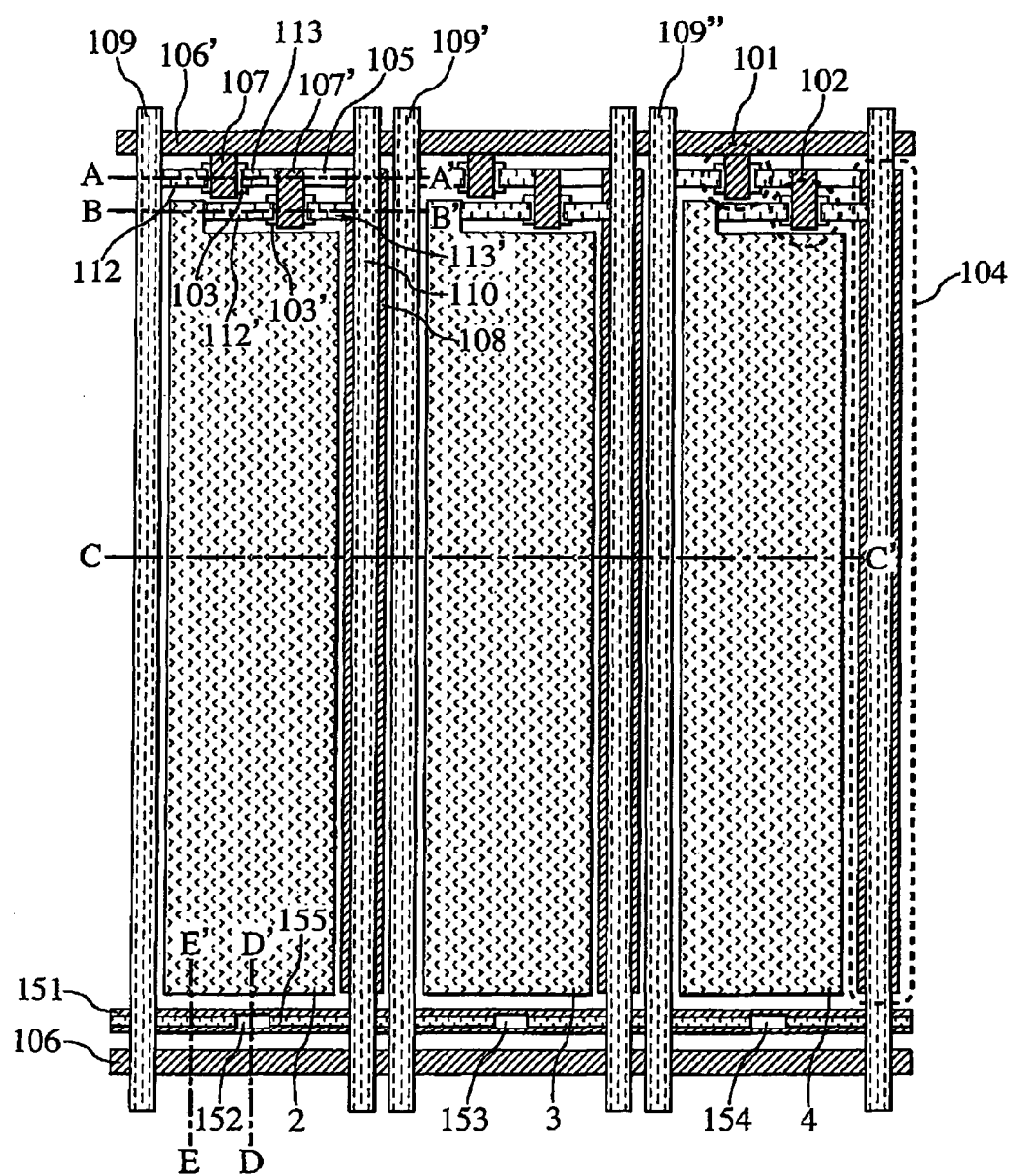
FIG. 9 is a plan view of a pixel of another organic light emitting display device.
Figure 10A:
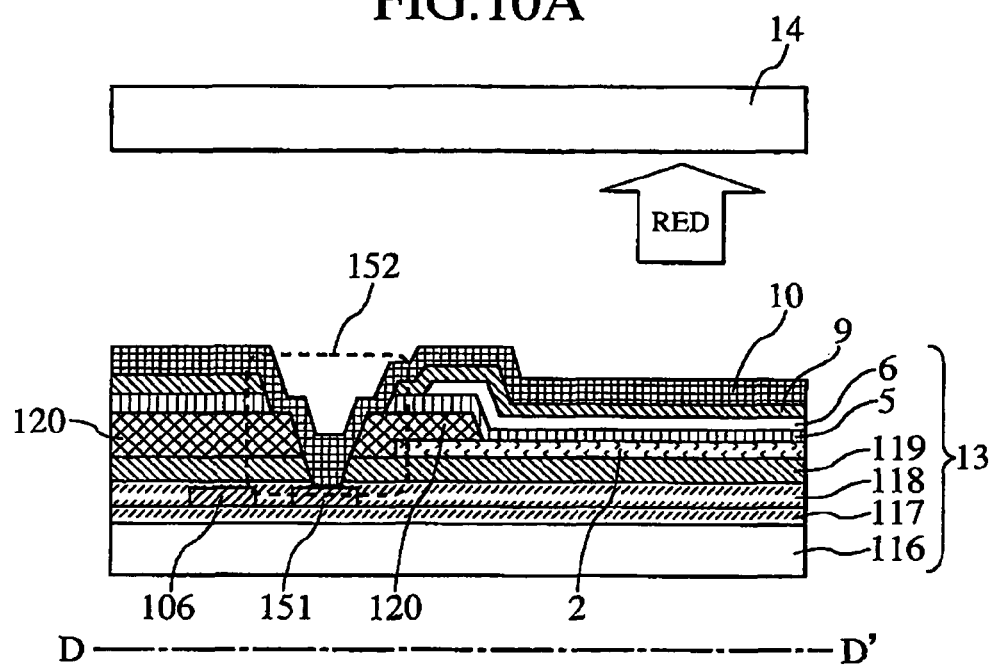
FIG. 10A is a cross sectional view taken along the line D-D' shown in FIG. 9.
Figure 10B:
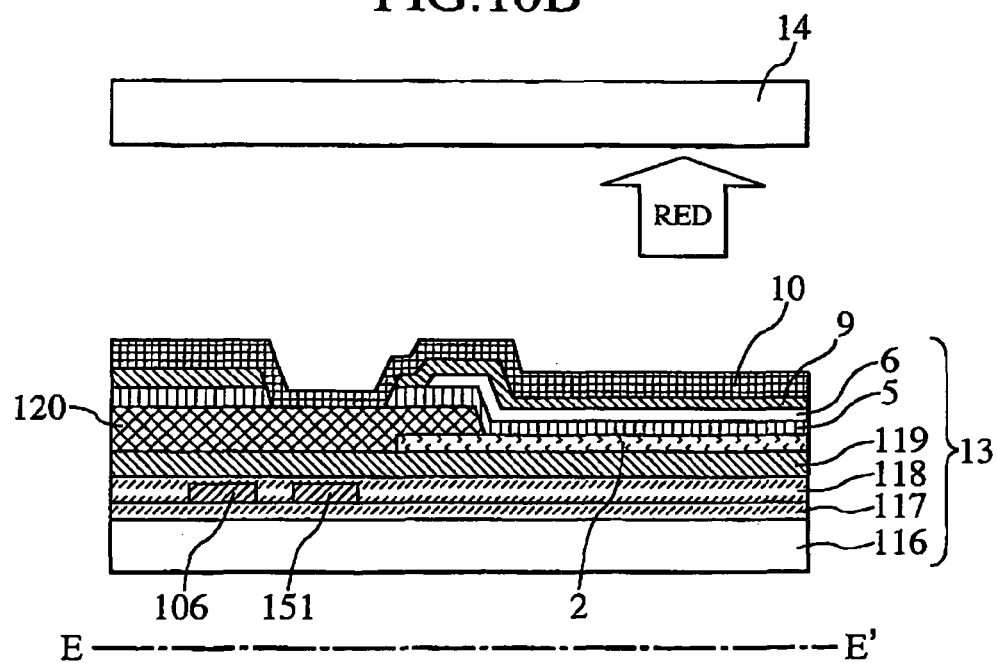
FIG. 10B is a cross sectional view taken along the line E-E' shown in FIG. 9.

Next, a fourth embodiment of the organic light emitting display device according to the invention is to be described. FIG. 9 is a plan view of a pixel of the organic light emitting display device. FIG. 10A is a cross sectional view taken along the line D-D' shown in FIG. 9, and FIG. 10B is a cross sectional view taken along the line E-E' shown in FIG. 9. This embodiment is characterized in that the organic layers 5 and 9 are removed in a linear form in order to electrically connect a second current supply line 151 and the upper transparent electrode 10 at a contact hole portion.

The method of forming the driving layer is identical with that in the first embodiment. The third interlayer insulating film 120, the hole transport layer 5, the R light emitting layer 6, the G light emitting layer 7, the B light emitting layer 8, and the electron transport layer 9 are formed thereabove. The manufacturing conditions for them are identical with those in the first embodiment.

Then, as shown in FIG. 10A, the organic film present at the contact hole portions 152, 153, and 154 electrically connecting the second current supply line 151 and the upper transparent electrode 10 is removed. The film is removed in a linear form in parallel with the second current supply line 151. Even when the organic film is removed as described above, since the second current supply line 151 and the upper transparent electrode 10 are electrically insulated by the second interlayer insulating film 119 and the third interlayer insulating film 120 as shown in FIG. 10B, they are connected electrically only at the contact hole portions 152, 153, and 154. Further, in the case of removal in the linear form, linear scanning is performed only one way in the direction of the data line, and this provides a merit that the tact time can be shortened.

Then, the upper transparent electrode 10 is formed thereover, and the opposed substrate 14 and the TFT substrate 13 are bonded. The manufacturing conditions are identical with those in the first embodiment.

In this embodiment, since the second current supply line 151 disposed in the same layer as those of the gate line 106 and the upper transparent electrode 10 are connected inside the pixel region in the same manner as in the first embodiment, unevenness of luminance in the display panel can be suppressed. Further, since the organic film present at the contact hole portions is removed in stripe shape, the tact time can be shortened, resulting in improved productivity.

In this embodiment, the organic layers 5 and 9 are removed by using a laser. A formation method using a precision mask is also possible. In that case, the organic layers 5 and 9 are formed by using a precision mask in an upper region from a removed portion 155 in FIG. 9 (the word "upper" is defined as the upper direction in the paper on which the figure is drawn, that is, an upper portion from the removed portion 155 with respect to the gate line 106, not illustrated) and in a lower region from the removed portion 155 shown in FIG. 9.

Fifth Embodiment

Figure 11:
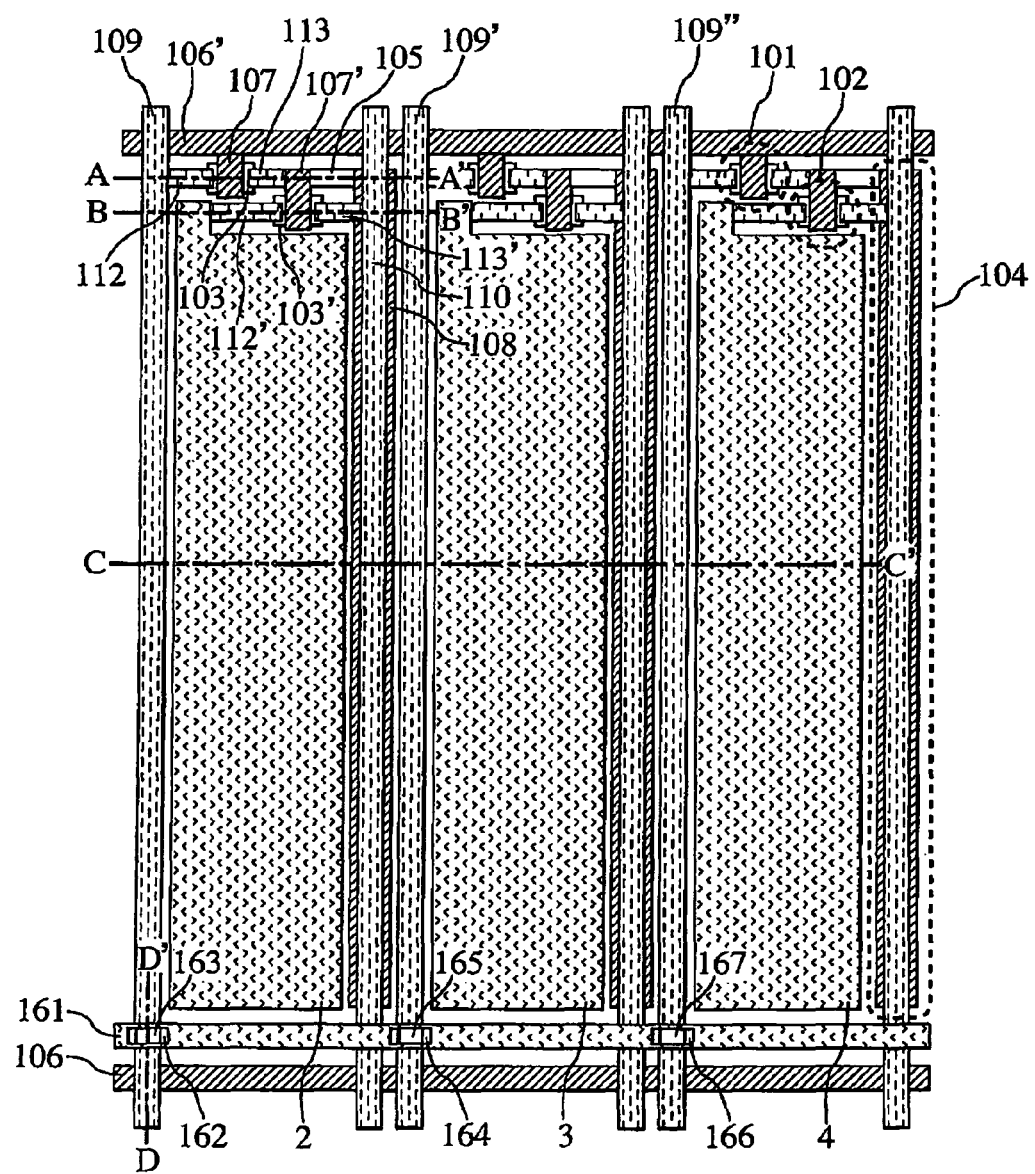
FIG. 11 is a plan view of a pixel of another organic light emitting display device.
Figure 12:
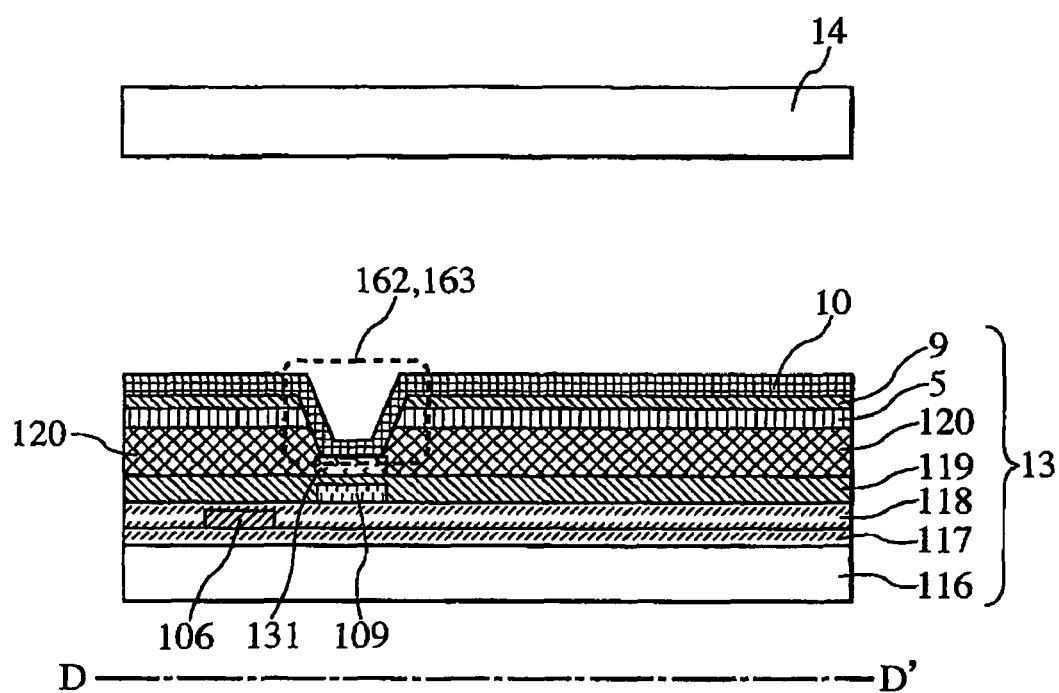
FIG. 12 is a cross sectional view taken along the line D-D' shown in FIG. 11.

Next, a fifth embodiment of the organic light emitting display device according to the invention is to be described. FIG. 11 is a plan view of a pixel of the organic light emitting display device, and FIG. 12 is a cross sectional view taken along the line D-D' shown in FIG. 11. This embodiment is characterized in that laser scanning is conducted in a direction parallel with the data line 109 in order to remove the organic layers 5 and 9 so that a second current supply line 161 and the upper transparent electrode 10 can be connected electrically at a contact hole portion.

The method of forming the driving layer is identical with that in the first embodiment. The third interlayer insulating film 120, the hole transport layer 5, the R light emitting layer 6, the G light emitting layer 7, the B light emitting layer 8, and the electron transport layer 9 are formed thereabove. The manufacturing conditions for them are identical with those in the first embodiment.

Then, the organic films present at contact hole portions 162, 164, and 166 electrically connecting the second current supply line 161 and the upper transparent electrode 10 are removed. Laser scanning is applied over data lines 109, 109', and 109''. At the contact hole portions 162, 164, and 166 formed in the third interlayer insulating film 120, laser light radiated to the data line is converted into heat, and the organic materials at those portions are eliminated by sublimation. The contact hole functions as a mask. On the other hand, on the data lines other than at the contact hole portions, since temperature elevation in the organic materials is suppressed by the third interlayer insulating film 120, the organic materials are not removed. Accordingly, electric connection is established only in the contact hole portions 162, 164, and 166. Further, in this method, since the linear scanning is performed only one way in the direction of the data line, the tact time is shortened. Also, since the material is removed not at the entire line, but only at the contact hole portions, the amount of the organic materials scattered in the apparatus for conducting laser abrasion is decreased, which provides a merit of a reduced failure rate.

On the other hand, by selecting the intensity of laser light and a wavelength at which the organic materials show high absorption, all of the organic materials on the data lines can be removed. Also in this case, since the second current supply line 151 and the upper transparent electrode 10 are insulated by the third interlayer insulating film 120, electric condition is established only in the contact hole portions 152, 153, and 154.

Then, the upper transparent electrode 10 is formed thereabove, and the opposed substrate 14 and the TFT substrate 13 are bonded. Manufacturing conditions are identical with those in the first embodiment.

In this embodiment, since the second current supply line 161 disposed in same the layer as those of the lower electrodes 2, 3, and 4 and the upper transparent electrode 10 are connected inside the pixel region in the same manner as in the second embodiment, unevenness of luminance in the display panel is suppressed. Further, since the organic film is removed by one-way scanning and only at the contact hole portion, the tact time is shorted, thus resulting in improved productivity and a reduced rate of failure due to the removed organic material.

Sixth Embodiment

Figure 13:
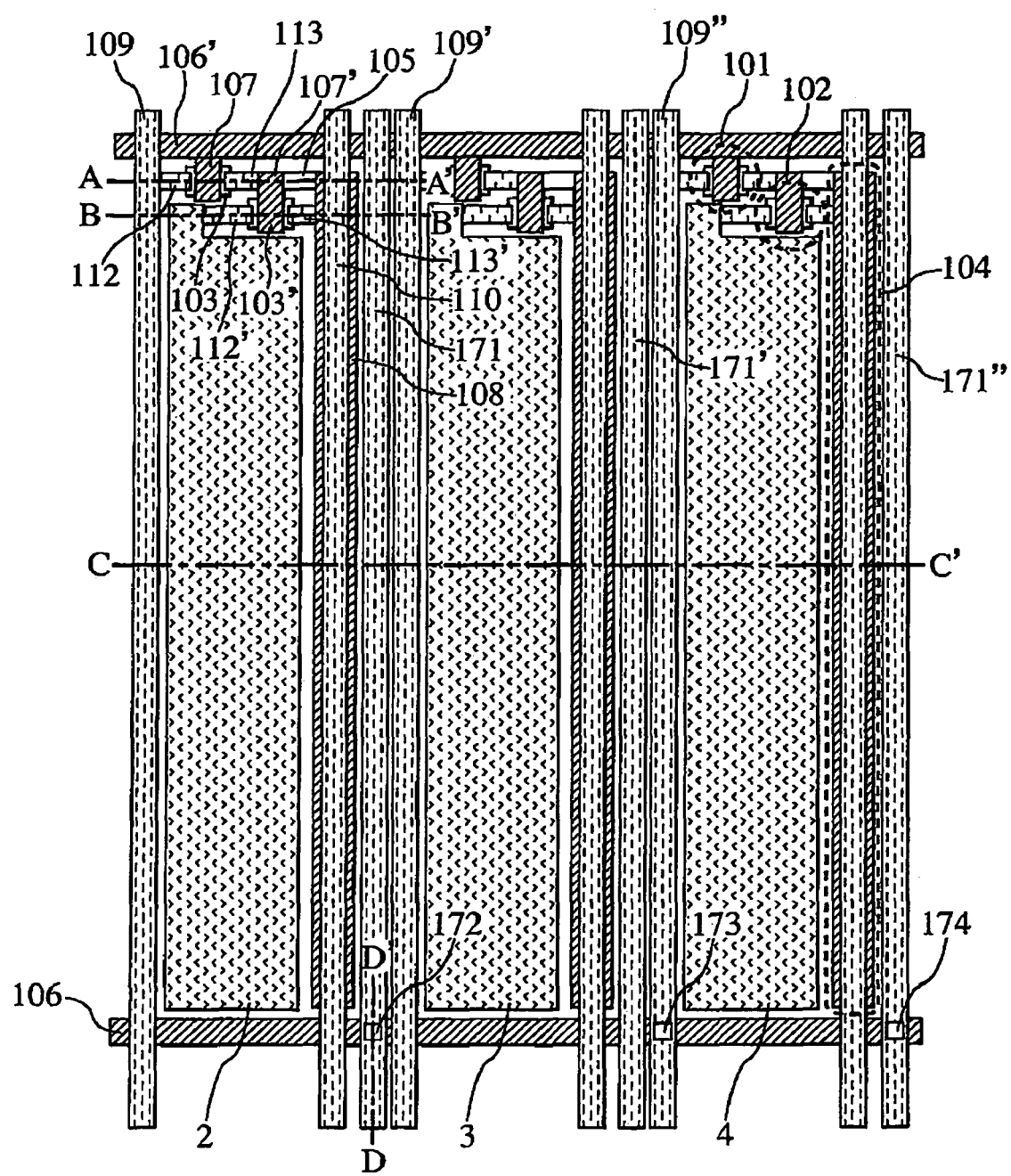
FIG. 13 is a plan view of a pixel of another organic light emitting display device.
Figure 14:
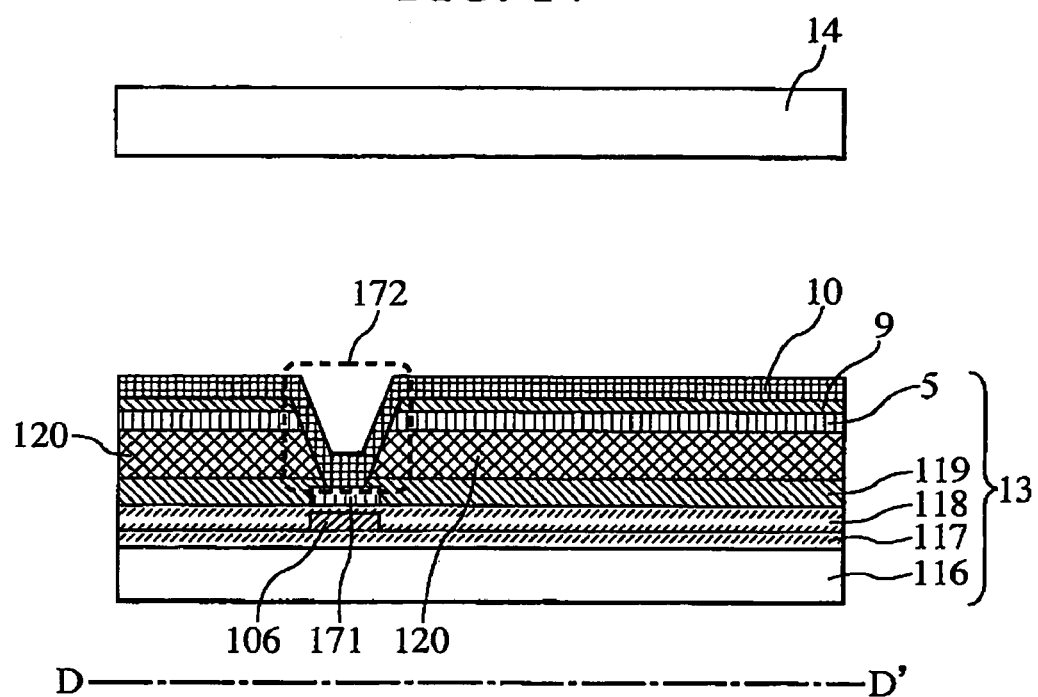
FIG. 14 is a cross sectional view taken along the line D-D' shown in FIG. 13.

Next, a sixth embodiment of the organic light emitting display device according to the invention is to be described. FIG. 13 is a plan view of a pixel of the organic light emitting display device, and FIG. 14 is a cross sectional view taken along the line D-D' shown in FIG. 13. This embodiment is characterized in that a second current supply line 171 arranged in parallel with the data line 109 and the first current supply line 110 is connected electrically to the upper transparent electrode 10 at the contact hole portion.

The method of forming the driving layer is identical with that in the first embodiment except for the formation of the second current supply line 171. For the second current supply line 171, the Al film used for forming the data line 109 and the first current supply line 110 is used. As shown in FIG. 13, the second current supply line 171 is disposed between the first current supply line 110 and the data line 109' of an adjacent sub-pixel. The third interlayer insulating film 120, the hole transport layer 5, the R light emitting layer 6, the G light emitting layer 7, the B light emitting layer 8, and the electron transport layer 9 are formed thereabove. The conditions for manufacturing them are identical with those in the first embodiment.

Then, the organic films present at contact hole portions 172, 173, and 174 for electrically connecting the second current supply line 171 and the upper transparent electrode 10 are removed. Portions of the second interlayer insulating film 119 and the third interlayer insulating film 120 are removed to form the contact hole.

Then, the upper transparent electrode 10 is formed thereover, and the opposed substrate 14 and the TFT substrate 13 are bonded. Manufacturing conditions are identical with those in the first embodiment.

In this embodiment, since the second current supply line 171 disposed in the same layer as those of the data line 109 and the first current supply line 110 and the upper transparent electrode 10 are connected inside the pixel region, unevenness of luminance in the display panel is suppressed. Further, since the contact hole is formed in the second interlayer insulating film and the third interlayer insulating film, a further reduced failure rate is attained, compared with the case where the upper electrode is connected to the second current supply line provided in the same layer as that of the gate line as in the first embodiment.

Further, as shown in the third embodiment, when the upper transparent electrode 10 and the second current supply line 171 are connected at the contact hole portion via a metal material in the same layer as those of the lower electrodes 2, 4, and 6, the failure rate can be reduced still further.

Seventh Embodiment

Figure 15:
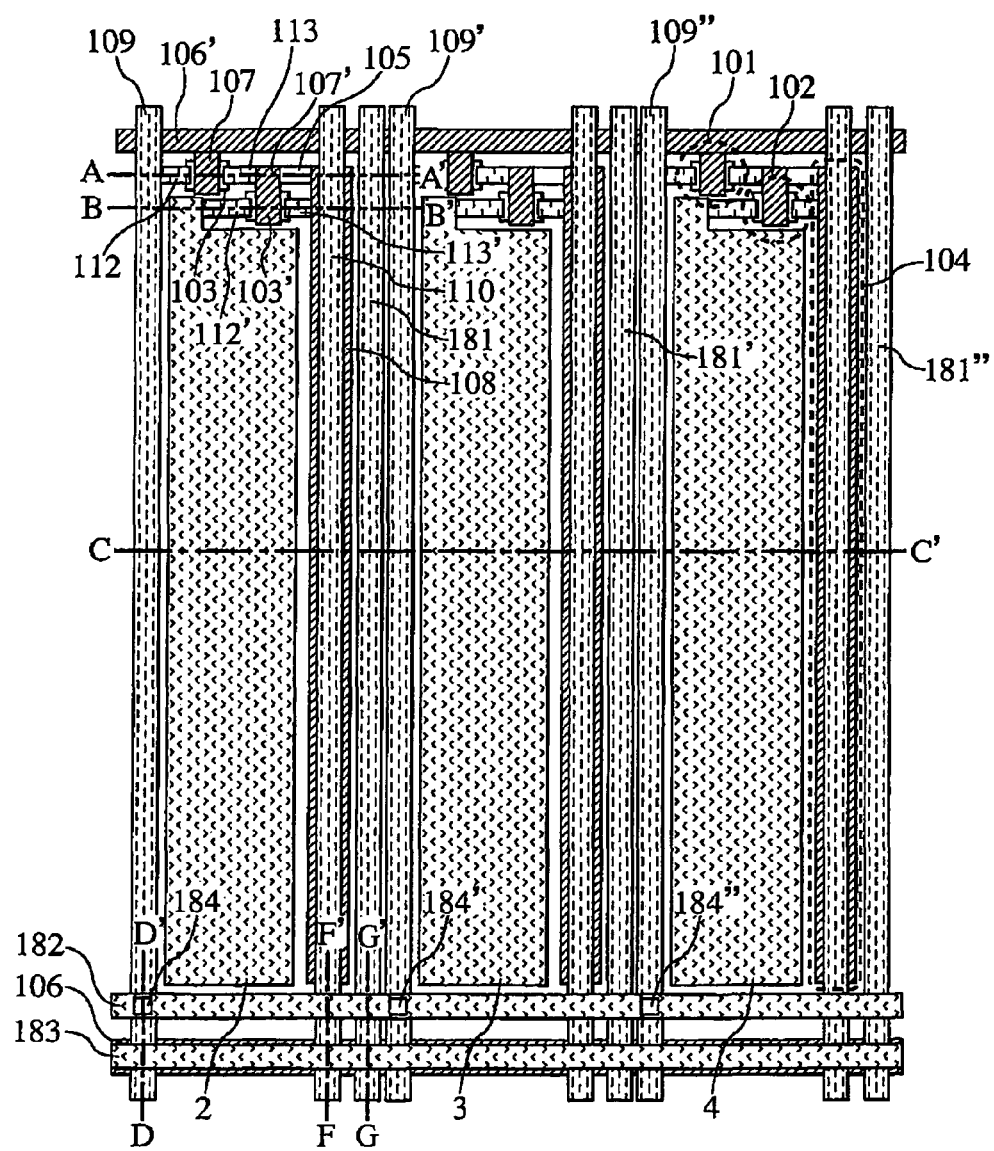
FIG. 15 is a plan view of a pixel of another organic light emitting display device.
Figure 16A:
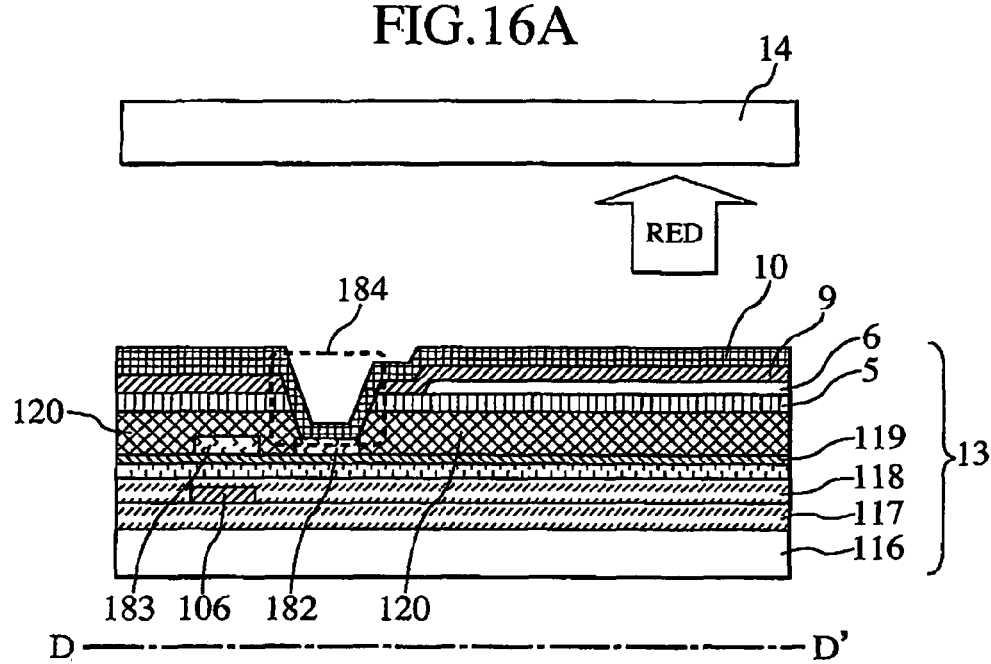
FIG. 16A is a cross sectional view taken along the line D-D' shown in FIG. 15.
Figure 16B:
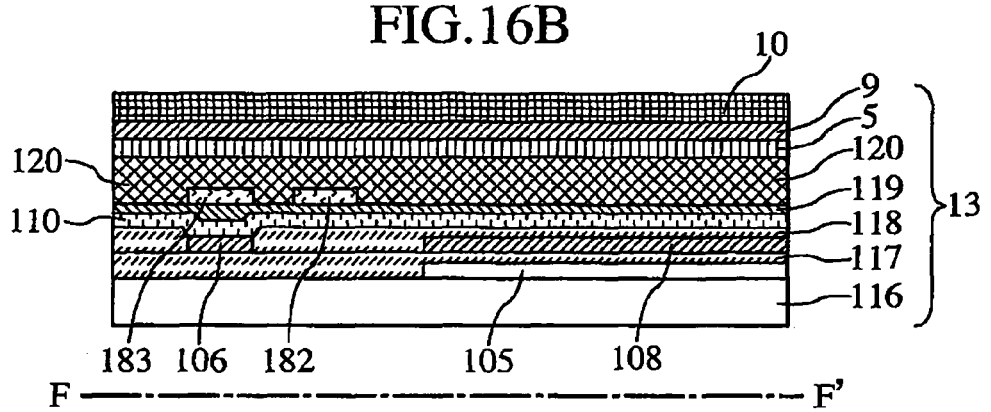
FIG. 16B is a cross sectional view taken along the line F-F' shown in FIG. 16.
Figure 16C:
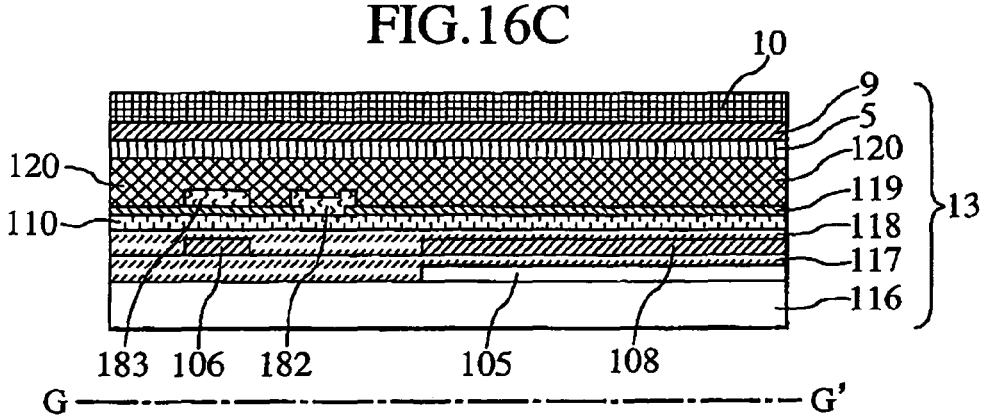
FIG. 16C is a cross sectional view taken along the line G-G' shown in FIG. 16.

Next a seventh embodiment of the organic light emitting display device according to the invention is to be described. FIG. 15 is a plan view of a pixel of the organic light emitting display device. FIG. 16A is a cross sectional view taken along the line D-D' shown in FIG. 15, FIG. 16B is a cross sectional view taken along the line F-F' shown in FIG. 15, and FIG. 16C is a cross sectional view taken along the line G-G' shown in FIG. 15. This embodiment is characterized in that the first current supply line 110 and a first current supply line 183 are arranged in parallel with and electrically connected with a data line and a gate line, respectively, and second current supply lines 181 and 182 are also arranged in parallel with and electrically connected with a data line and a gate line, respectively, so that the current supply lines are arranged in matrix form.

The method of forming the driving layer is identical with that in the first embodiment except that the first current supply line and the second current supply line are formed into a plurality of metal layers and electrically connected. The method of forming the first current supply line 110 is identical with that in the first embodiment. The first current supply line 183 is formed on the gate line 106 by using a metal material in the same layer as those of lower electrodes 2, 4, and 6. As shown in FIG. 16B, the first current supply line 110 is connected electrically with the first current supply line 183 via a contact hole formed in the second interlayer insulating film 119.

The method of forming the second current supply line 181 is identical with that in the sixth embodiment. The method of forming the current supply line 182 is identical with that in the first embodiment. As shown in FIG. 16C, the second current supply line 181 is connected electrically with the second current supply line 182 via contact holes formed in the first interlayer insulating film 118 and the second interlayer insulating film 119. The third interlayer insulating film 120, the hole transport layer 5, the R light emitting layer 6, the G light emitting layer 7, the B light emitting layer 8, and the electron transport layer 9 are formed thereabove. The conditions for manufacturing them are identical with those in the first embodiment.

Then, the organic films present at contact hole portions 184, 184', and 184" for electrically connecting the second current supply line 182 and the upper transparent electrode 10 are removed. To form the contact holes, portions of the third interlayer insulating film 120 are removed.

Then, the upper transparent electrode 10 is formed thereover, and the opposed substrate 14 and the TFT substrate 13 are bonded. Manufacturing conditions are identical with those in the first embodiment.

In this embodiment, since the second current supply line 182 disposed in the same layer as those of the lower electrodes 2, 3, and 4 and the upper transparent electrode 10 are connected inside the pixel region in the same manner as in the second embodiment, the unevenness of luminance in the display panel is suppressed. Further, since the first current supply lines as well as the second current supply lines are arranged in parallel with the data line and the gate line to form a matrix, unevenness of luminance due to wiring resistance is further suppressed, and as a result, image-quality impairment due to smears, etc. is suppressed.

In this embodiment, while both the first current supply lines and the second current supply lines are arranged in matrix form, it is also possible to arrange only the first current supply lines in matrix form or arrange only the second current supply lines in matrix form. Also possible are a combination where the first current supply line is in the same layer as that of the data line and that of the lower electrode and a combination where the second current supply line is in the same layer as that of the data line and that of the gate line.

Eighth Embodiment

Figure 17:
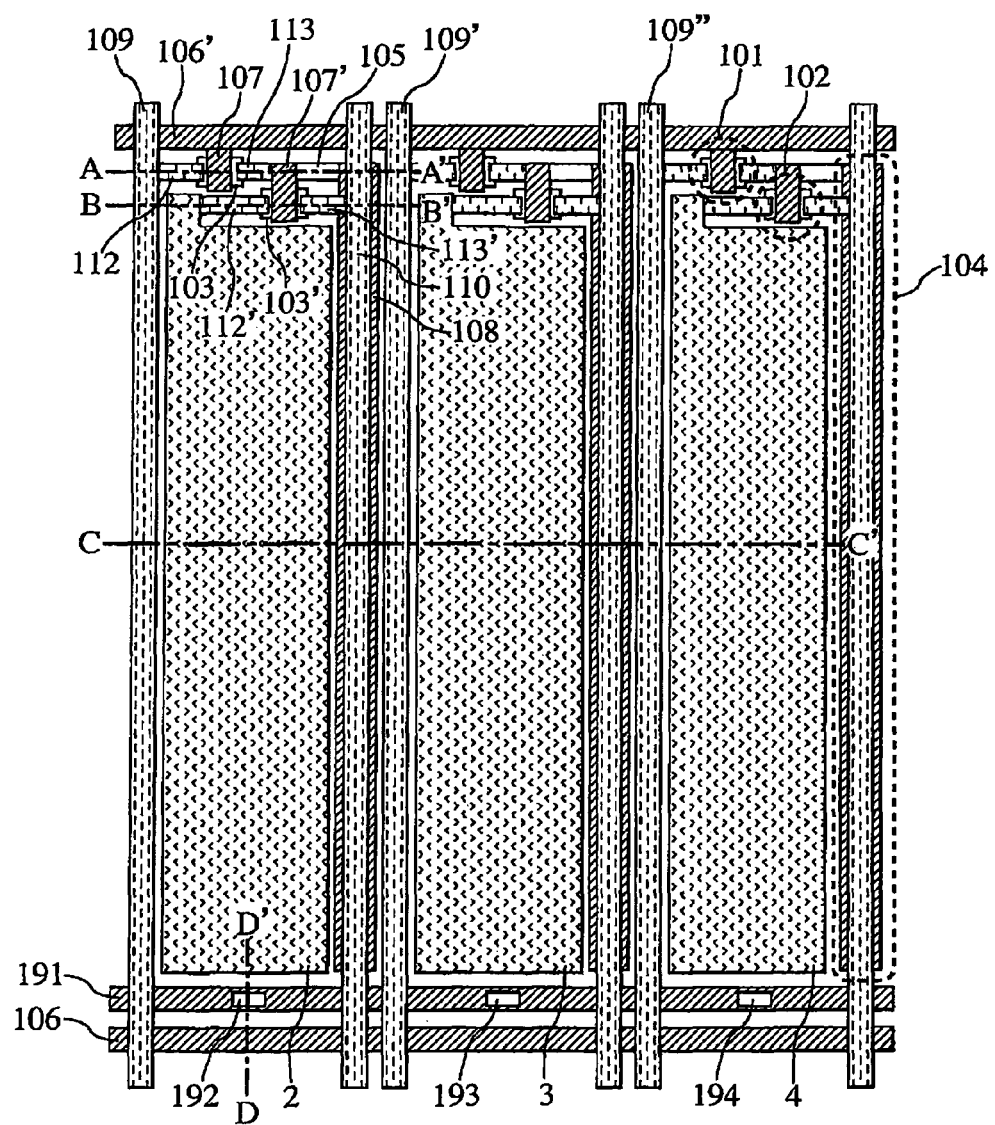
FIG. 17 is a plan view of a pixel of another organic light emitting display device.
Figure 18:
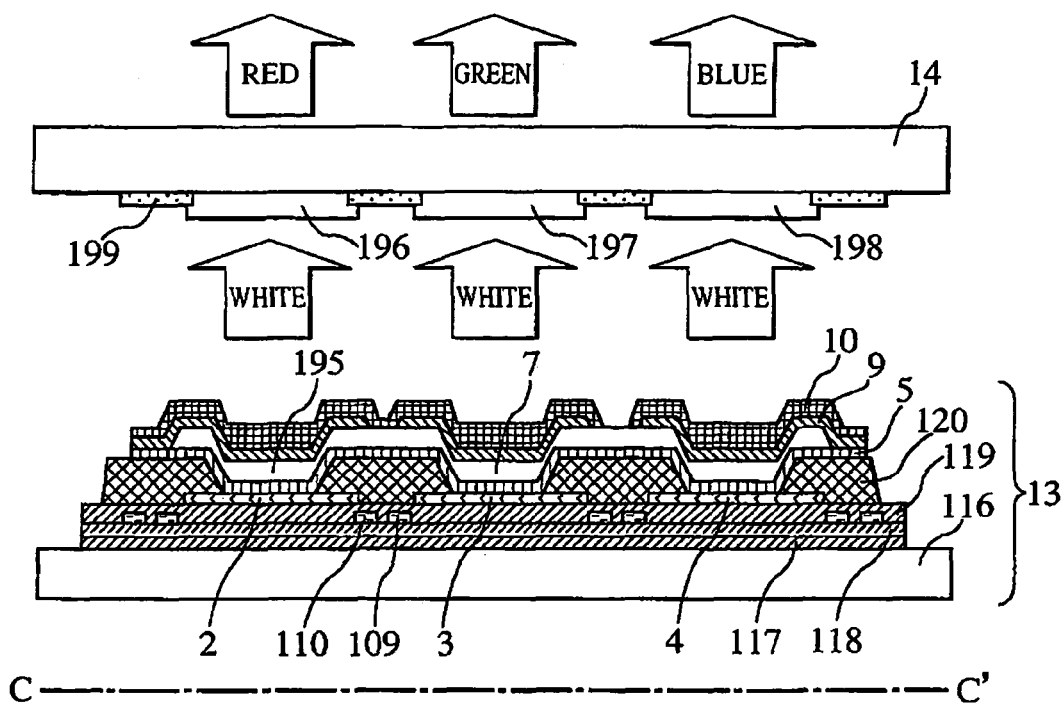
FIG. 18 is a cross sectional view taken along the line C-C' shown in FIG. 17.
Figure 19:
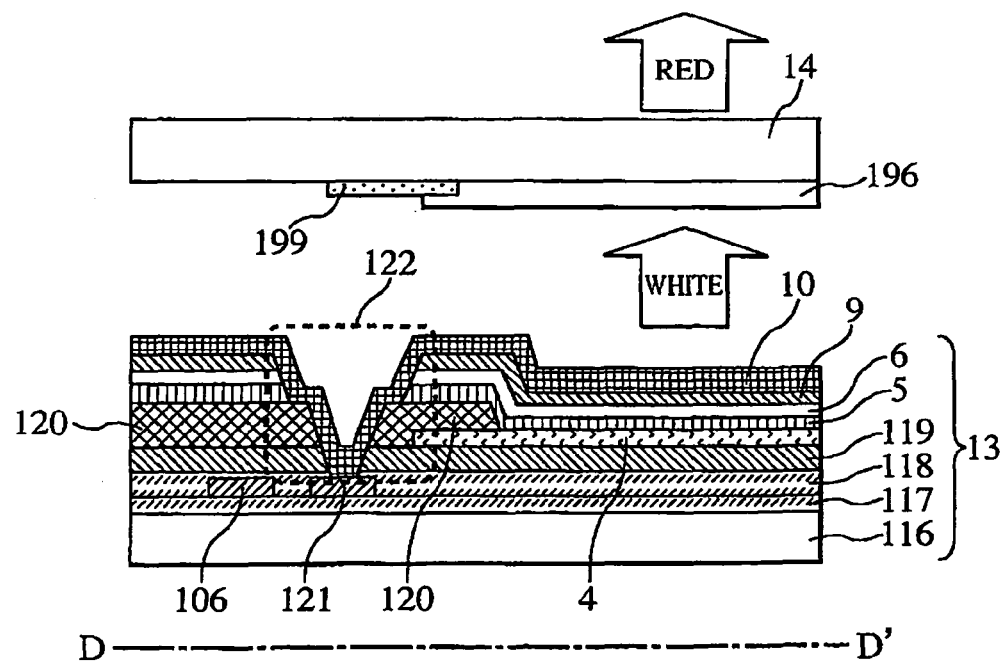
FIG. 19 is a cross sectional view taken along the line D-D' shown in FIG. 17.

Then, an eighth embodiment of the organic light emitting display device according to the invention is to be described. FIG. 17 is a plan view of a pixel of the organic light emitting display device, FIG. 18 is a cross sectional view taken along the line C-C' shown in FIG. 17, and FIG. 19 is a cross sectional view taken along the line D-D' shown in FIG. 17. This embodiment is characterized in that a white color light emitting element is used for the organic EL element as a pixel, and a color filter is formed on the opposed substrate.

The method of forming the driving layer is identical with that in the first embodiment. The third interlayer insulating film 120 and the hole transport layer 5 are formed thereabove. Then, the B light emitting layer and the R light emitting layer shown in the first embodiment are stacked thereon as a white light emitting layer (W light emitting layer) 195. The film forming conditions are identical with those in the first embodiment.

The electron transport layer 9 and the upper transport electrode 10 are formed thereabove. Manufacturing conditions for them are identical with those in the first embodiment.

Then, the organic films present at contact hole portions 192, 193, and 194 for electrically connecting a second current supply line 191 and the upper transparent electrode 10 are removed. In this case, the organic materials constituting the hole transport layer 5, the W light emitting layer 195, and the electron transport layer 9 are removed. To form the contact holes, portions of the first interlayer insulating film 118, the second interlayer insulating film 119, and the third interlayer insulating film 120 are removed. Then, the upper transparent electrode 10 is formed thereon. Manufacturing conditions are identical with those in the first embodiment.

On the opposed substrate 14, color filters 196, 197, and 198 and a black matrix 199 are formed. Then, the opposed substrate 14 and the TFT substrate 13 are bonded. The manufacturing conditions are identical with those in the first embodiment.

In this embodiment, since the second current supply line 182 disposed in the same layer as those of the lower electrodes 2, 3, and 4 and the upper transparent electrode 10 are connected inside the pixel region in the same manner as in the second embodiment, the unevenness of luminance in the display panel is suppressed.

In this embodiment, each sub-pixel is not separately patterned with the W light emitting layer, but the entire display region is patterned with it like other transport layers 5 and 9. Portions of the W light emitting layer are removed in the same manner as with other transport layers in order to electrically connect the upper transparent electrode 10 and the second current supply line 191. Further, the respective techniques used in the second to seventh embodiments are also applicable to this embodiment.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method of manufacturing an organic light emitting display device in which a driving layer containing a driving element for driving an organic light emitting element and the organic light emitting element are sequentially stacked above a substrate, and an upper transparent electrode, out of a pair of electrodes putting an organic layer of the organic light emitting element therebetween, and a current supply line, formed in a layer different from that of the upper transparent electrode, are connected electrically, and further including a data line arranged perpendicular to the current supply line, wherein the method includes the steps of forming the organic layer excluding a light emitting layer therefrom over the entire display region and then removing, by laser scanning, the organic layer corresponding to a portion where the upper transparent electrode and the current supply line are electrically connected, wherein the laser scanning is conducted in a direction parallel with the data line and the laser scanning is applied over the data line.

2. The method according to claim 1, wherein a portion of the organic layer is removed in linear form.

3. The method according to claim 1, wherein a portion of the organic layer is removed in dot form.

4. The method according to claim 1, wherein the current supply line comprises a second current supply line and a first current supply line arranged in perpendicular with the second current supply line, and wherein the first current supply line and the second current supply line are formed in matrix form.

5. The method according to claim 1, wherein emission light from the organic light emitting device has at least spectral components in blue, green, and red color regions, and the organic light emitting display device includes a color conversion layer outside the organic light emitting device.

6. The method according to claim 1, wherein said current supply line is formed in a layer in which a lower electrode, out of said pair of electrodes, is formed.

7. The method according to claim 1, further comprising:
providing an insulating film to electrically insulate the current supply line and the upper transparent electrode; and
forming a contact hole portion in the insulating film;
wherein the contact hole portion is formed at a position where the data line and the current supply line intersect.

* * * * *